United States Patent
Tsukada et al.

(10) Patent No.: US 11,892,144 B2
(45) Date of Patent: Feb. 6, 2024

(54) LED LIGHTING SHEET FOR ANIMAL/PLANT GROWTH, LED LIGHTING MODULE FOR ANIMAL/PLANT GROWTH, SHELF FOR ANIMAL/PLANT GROWTH RACK, ANIMAL/PLANT GROWTH RACK, AND ANIMAL/PLANT GROWTH FACTORY

(71) Applicant: DAI NIPPON PRINTING CO., LTD., Tokyo-to (JP)

(72) Inventors: Dai Tsukada, Tokyo-to (JP); Naoto Kamekawa, Tokyo-to (JP); Daisuke Goto, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 112 days.

(21) Appl. No.: 17/427,758

(22) PCT Filed: Jan. 23, 2020

(86) PCT No.: PCT/JP2020/002422
§ 371 (c)(1),
(2) Date: Mar. 18, 2022

(87) PCT Pub. No.: WO2020/158584
PCT Pub. Date: Aug. 6, 2020

(65) Prior Publication Data
US 2022/0243901 A1    Aug. 4, 2022

(30) Foreign Application Priority Data
Feb. 1, 2019   (JP) ................................. 2019-017453

(51) Int. Cl.
*F21V 19/00*  (2006.01)
*F21V 23/00*  (2015.01)
(Continued)

(52) U.S. Cl.
CPC ............ *F21V 19/003* (2013.01); *A01G 7/045* (2013.01); *A01K 29/00* (2013.01); *F21V 23/003* (2013.01);
(Continued)

(58) Field of Classification Search
CPC ..... F21V 19/003; F21V 23/003; A01G 7/045; A01K 29/00; H01L 25/0753; H01L 33/647; F21Y 2105/10; F21Y 2115/10
See application file for complete search history.

(56) References Cited

U.S. PATENT DOCUMENTS 5,012,609 A * 5/1991 Ignatius .................. A01G 7/045
                                                                47/1.01 R
10,165,735 B1 * 1/2019 Carlie ..................... H05B 45/20
(Continued)

FOREIGN PATENT DOCUMENTS

JP     2008-91459 A    4/2008
JP     2008-118957 A   5/2008
(Continued)

OTHER PUBLICATIONS

Nakanishi et al., JP2013-157441, machine translation (Year: 2013).*
(Continued)

*Primary Examiner* — Tracie Y Green
(74) *Attorney, Agent, or Firm* — Oliff PLC

(57) ABSTRACT

An LED lighting sheet (20) for animal/plant growth includes an array of LED chips (21). At any location 50 mm away from the LED chips (21) in a lower region below the LED lighting sheet (20) for animal/plant growth, a photosynthetic photon flux density converted by input power and normalized by an average value over the lower region is greater than or equal to 0.2. A variation in photosynthetic photon flux densities respectively measured at locations 50 mm away from the LED chips (21) in the lower region below the
(Continued)

LED lighting sheet (20) for animal/plant growth is less than or equal to 0.5 in standard deviation when normalized by the average value.

12 Claims, 11 Drawing Sheets

(51) Int. Cl.
*H01L 25/075* (2006.01)
*A01G 7/04* (2006.01)
*A01K 29/00* (2006.01)
*F21Y 105/10* (2016.01)
*F21Y 115/10* (2016.01)
*H01L 33/64* (2010.01)

(52) U.S. Cl.
CPC ...... *H01L 25/0753* (2013.01); *F21Y 2105/10* (2016.08); *F21Y 2115/10* (2016.08); *H01L 33/647* (2013.01)

(56) References Cited

U.S. PATENT DOCUMENTS

| | | | |
|---|---|---|---|
| 11,477,945 B2 * | 10/2022 | Beers | C09K 11/7763 |
| 11,589,433 B2 * | 2/2023 | Vilgiate | H05B 47/19 |
| 2012/0113650 A1 * | 5/2012 | Inoue | C03C 4/16 501/18 |
| 2017/0245440 A1 * | 8/2017 | Cho | F21V 9/02 |
| 2021/0351328 A1 * | 11/2021 | Goto | H01L 33/62 |

FOREIGN PATENT DOCUMENTS

| | | |
|---|---|---|
| JP | 2013-157441 A | 8/2013 |
| JP | 2013-251230 A | 12/2013 |
| JP | 2014-122296 A | 7/2014 |
| JP | 2015-138902 A | 7/2015 |
| JP | 2019-016617 A | 1/2019 |
| JP | 2019-016631 A | 1/2019 |

OTHER PUBLICATIONS

Rohm, JP 2008-91459, machine translation Apr. 2008 (Year: 2008).*
Thin and light sheet-type surface emitting LED lighting for plant factories Launched (Year: 2018).*
Mar. 24, 2020 International Search Report issued in International Patent Application No. PCT/JP2020/002422.
"Launched Thin and Light Sheet-Type Surface Emitting Led Lighting for Plant Factories". Dec. 6, 2018, [retrieval date Mar. 6, 2020], <URL: https://www.dnp.eo.jp/news/detail/1190662_1587_html>.
Jul. 17, 2020 Office Action issued in Japanese Patent Application No. 2019-017453.
Aug. 21, 2020 Office Action issued in Japanese Patent Application No. 2019-017453.
Dec. 22, 2020 Office Action issued in Japanese Patent Application No. 2019-017453.
Mar. 19, 2021 Office Action issued in Japanese Patent Application No. 2020-193702.
May 18, 2021 Office Action issued in Japanese Patent Application No. 2020-193702.
Jul. 27, 2021 International Preliminary Report on Patentability issued in International Patent Application No. PCT/JP2020/002422.

* cited by examiner

LED LIGHTING SHEET FOR ANIMAL/PLANT GROWTH, LED LIGHTING MODULE FOR ANIMAL/PLANT GROWTH, SHELF FOR ANIMAL/PLANT GROWTH RACK, ANIMAL/PLANT GROWTH RACK, AND ANIMAL/PLANT GROWTH FACTORY

TECHNICAL FIELD

The present disclosure relates to an LED lighting sheet for animal/plant growth, an LED lighting module for animal/plant growth, a shelf for an animal/plant growth rack, an animal/plant growth rack, and an animal/plant growth factory.

BACKGROUND ART

In recent years, there are growing demands for lighting units that use low-power consumption LEDs as light sources in place of existing fluorescent lights, high-pressure sodium lights, and the like as lighting units to be used in plant growth factories.

A plant cultivation apparatus in which a plurality of straight-tube plant growth lights using LEDs as light sources is arranged in shelves for plant cultivation racks is known as an example of plant cultivation factories that use lighting units using LEDs as light sources (see, for example, PTL 1).

An LED lighting unit for animal/plant growth, in which a plurality of LED chips is arranged on a flexible circuit board to form a surface light source, is also suggested (see, for example, PTL 2).

CITATION LIST

Patent Literature

PTL 1: Japanese Unexamined Patent Application Publication No. 2008-118957
PTL 2: Japanese Unexamined Patent Application Publication No. 2013-251230

The present disclosure provides an LED lighting sheet for animal/plant growth, an LED lighting module for animal/plant growth, a shelf for an animal/plant growth rack, an animal/plant growth rack, and an animal/plant growth factory, which are capable of obtaining animals and/or plants with a high yield by equalizing the growth speed of animals and/or plants in a plane.

SUMMARY OF INVENTION

An LED lighting sheet for animal/plant growth according to an embodiment includes an array of LED chips. At any location 50 mm away from the LED chips in a lower region below the LED lighting sheet for animal/plant growth, a photosynthetic photon flux density converted by input power and normalized by an average value over the lower region is greater than or equal to 0.2, and a variation in photosynthetic photon flux densities respectively measured at locations 50 mm away from the LED chips in the lower region below the LED lighting sheet for animal/plant growth is less than or equal to 0.5 in standard deviation when normalized by the average value.

In the LED lighting sheet for animal/plant growth according to the embodiment, ten or more of the LED chips may be arranged in series, and four or more rows of the LED chips arranged in series may be arranged in parallel.

In the LED lighting sheet for animal/plant growth according to the embodiment, the LED chips may be covered with a transparent protective film.

The LED lighting sheet for animal/plant growth according to the embodiment may further include a substrate film, and a metal wiring portion formed on a surface of the substrate film, and the plurality of LED chips may be implemented on the metal wiring portion.

In the LED lighting sheet for animal/plant growth according to the embodiment, a thickness of a thickest part may be less than or equal to 5 mm.

An LED lighting module for animal/plant growth according to the embodiment includes the LED lighting sheet for animal/plant growth according to the embodiment, and a controller electrically connected to the LED lighting sheet for animal/plant growth.

A shelf for an animal/plant growth rack according to the embodiment includes a board, and the LED lighting sheet for animal/plant growth according to the embodiment or the LED lighting module for animal/plant growth according to the embodiment, attached to the board.

An animal/plant growth rack according to the embodiment includes a shelf, and the shelf includes the LED lighting sheet for animal/plant growth according to the embodiment or the LED lighting module for animal/plant growth according to the embodiment, attached to a lower side of a board.

In the animal/plant growth rack according to the embodiment, a light reflection sheet may be placed to a side of the shelf.

An animal/plant growth factory according to the embodiment includes a building, and the animal/plant growth rack according to the embodiment, placed in the building.

According to the embodiment, animals and/or plants are obtained with a high yield by equalizing the growth speed of animals and/or plants in a plane.

DESCRIPTION OF EMBODIMENTS

Figure 1:
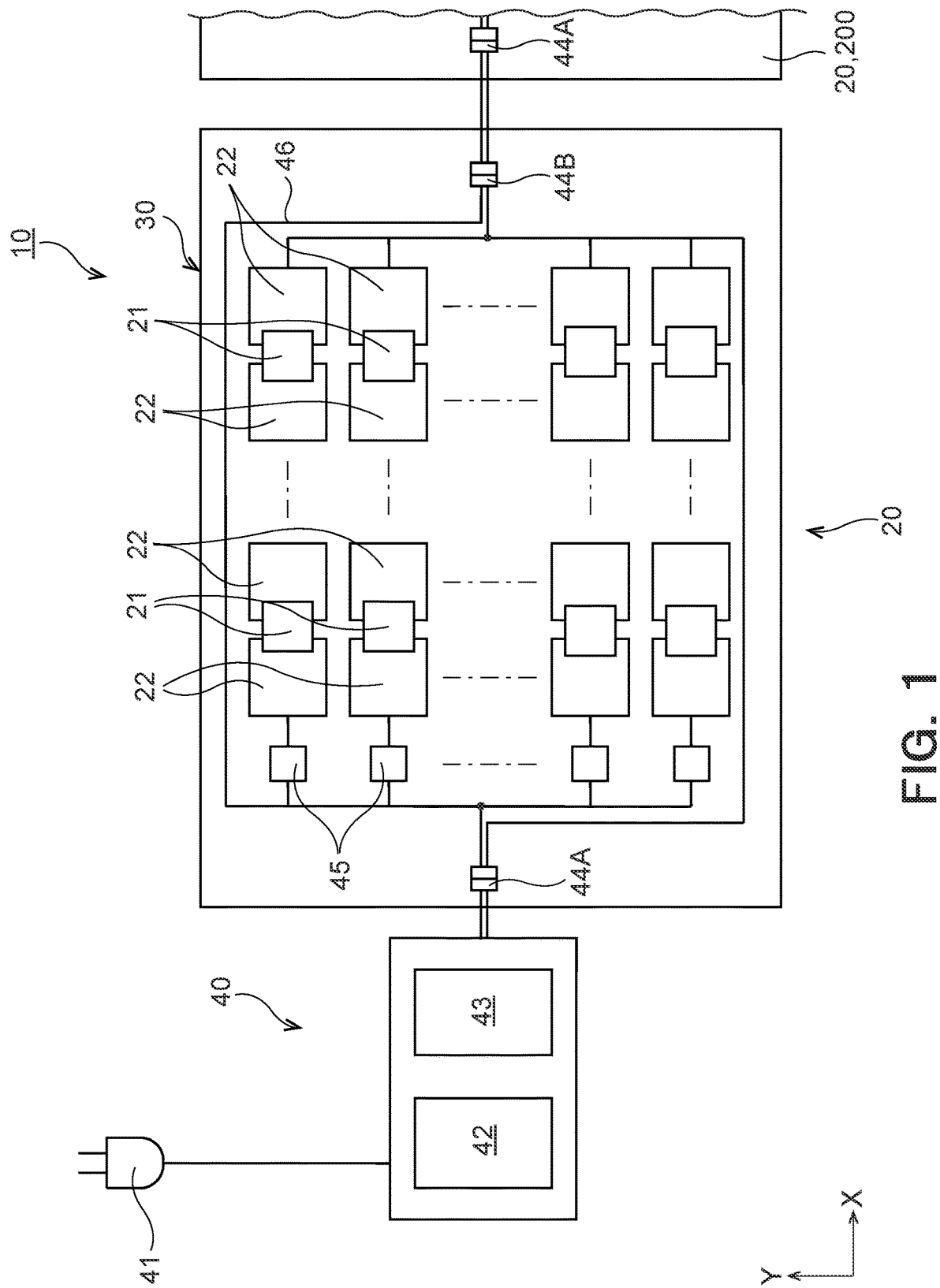
FIG. 1 is a schematic view showing an LED lighting module according to an embodiment.

An LED lighting sheet for animal/plant growth according to an embodiment includes an array of LED chips. At any location 50 mm away from the LED chips in a lower region below the LED lighting sheet for animal/plant growth, a photosynthetic photon flux density converted by input power and normalized by an average value over the lower region is greater than or equal to 0.2, and a variation in photosynthetic photon flux densities respectively measured at locations 50 mm away from the LED chips in the lower region below the LED lighting sheet for animal/plant growth is less than or equal to 0.5 in standard deviation when normalized by the average value.

The LED lighting sheet for animal/plant growth according to the present embodiment is a sheet LED lighting unit, so the overall thickness is reduced as compared to an LED bar light including an array of straight-tube LEDs. Therefore, a vertical space between shelves of an animal/plant growth rack can be reduced to improve the floor area yield of an animal/plant growth factory for animals and/or plants grown. Because the thickness of the LED chips is less than the thickness of the LED straight tubes, the LED lighting sheet reduces a difference in height between a region where the LED chips are placed and a region where the LED chips are not placed as compared to a difference in height between a region where the LED straight tubes are placed and a region where the LED straight tubes are not placed. Therefore, a shadow hardly appears to the side of each LED chip, so variations of light irradiated to animals and/or plants are reduced even when the animals and/or plants grow up and get close to the LED lighting sheet. In the LED lighting unit for animal/plant growth, a reduction of variations of light irradiated to animals and/or plants leads to a reduction of nonconforming products by setting the size and quality of animals and/or plants grown within the range of certain specifications, so it is important. In growing animals and/or plants, control over light and heat irradiated to animals and/or plants during a late growth stage in which animals and/or plants grow up and photosynthesis becomes active is important. The LED lighting sheet for animal/plant growth according to the present embodiment is capable of reducing variations of relatively strong light irradiated to animals and/or plants when the animals and/or plants are close to the LED lighting sheet.

In the LED lighting sheet for animal/plant growth according to the present embodiment, at any location 50 mm away from the LED chips in a lower region below the LED lighting sheet for animal/plant growth, a photosynthetic photon flux density (PPFD) converted by input power and normalized by an average value over the lower region is greater than or equal to 0.2, so the growth rate of animals and/or plants grown can be increased while a decrease in the yield of animals and/or plants grown is suppressed, with the result that animals and/or plants are obtained with a high yield. In the LED lighting unit for animal/plant growth, even when the growth rate of animals and/or plants is tried to be increased by simply increasing the amount of light, but when variations of the light are not reduced, variations further increase, and nonconforming products increase, with the result that the yield may decrease on the contrary. With the sheet LED lighting unit according to the present embodiment, even with light of which a PPFD converted by input power and normalized by an average value over the lower region is 0.2, variations are reduced, and a high yield is obtained.

Generally, in an animal/plant growth factory, to further rapidly grow animals and/or plants, it is presumably preferable to increase the photosynthetic photon flux density PPFD of light irradiated from the LED chips. However, it has been found that, when the PPFD of light irradiate from the LED chips is increased, variations in growth speed occur among a plurality of animals and/or plants placed in a plane. Particularly, it has been found that the growth speed varies in a late growth stage of animals and/or plants and, as a result, defective growth, such as insufficient growth of some of animals and/or plants and occurrence of growth impairment called tip burn in some of animals and/or plants. This is presumably because, in a late growth stage of animals and/or plants, the animals and/or plants approach the upper LED lighting sheet, a large amount of light is supplied to animals and/or plants close to the LED chips while sufficient light is not supplied to animals and/or plants far from the LED chips, and, as a result, a difference in growth speed occurs between these animals and/or plants. According to the present embodiment, a variation in photosynthetic photon flux densities respectively measured at locations 50 mm away from the LED chips in the lower region below the LED lighting sheet for animal/plant growth are less than or equal to 0.5 in standard deviation when normalized by the average value. In this way, by reducing a variation in PPFDs at locations close to the LED chips (that is, locations 50 mm away from the LED chips), the amount of light is equalized below the LED lighting sheet and at locations close to the LED chips. As a result, at locations close to the LED chips, the amount of light irradiated from the LED chips is equal in a plane, with the result that a place where the amount of light irradiated is insufficient is eliminated in the lower region below the LED lighting sheet. Particularly, the growth speeds of animals and/or plants in a late growth stage of animals and/or plants are equalized in the plane. A place where the amount of light irradiated from the LED chips is excessive disappears, so an occurrence of growth impairment called tip burn in animals and/or plants is reduced.

An LED lighting module for animal/plant growth according to the present embodiment includes the LED lighting sheet for animal/plant growth according to the embodiment, and a controller electrically connected to the LED lighting sheet, so the growth speeds of animals and/or plants are equalized in the plane, with the result that animals and/or plants are obtained with a high yield. A shelf for an animal/plant growth rack, an animal/plant growth rack, and an animal/plant growth factory according to the embodiment each include the LED lighting sheet or module for animal/plant growth according to the embodiment, so the growth speeds of animals and/or plants are equalized in the plane, with the result that animals and/or plants are obtained with a high yield.

Hereinafter, an embodiment will be specifically described with reference to the drawings. The drawings described below are schematically shown. Therefore, the size and shape of each portion are exaggerated as needed for the purpose of easy understanding. The embodiment may be modified as needed without departing from the technical idea. In the drawings described below, like reference signs denote the same portions, and the detailed description may be partially omitted. The numeric values, such as dimensions, and material names of members described in the specification are illustrative as the embodiment and are not limited thereto. The numeric values and material names may be selected and used as needed. In the specification, terms that specify shapes and geometrical conditions, for example, terms, such as parallel, perpendicular, and vertical, mean not only the strict senses of the terms but also substantially the same states. In the specification, animal/plant mean animals and/or plants. Hereinafter, for the sake of convenience, an example in which plants are grown (cultivated) with the LED lighting module will be described. It is also applicable to the case where animals are grown as long as no contradiction arises.

LED Lighting Module for Plant Growth

An LED lighting module 10 for plant growth (hereinafter, also referred to as LED lighting module 10) according to the present embodiment, shown in FIG. 1, is installed in a plant growth factory 90 (FIG. 8) using artificial light and used to grow plants, as will be described later. The LED lighting module 10 includes an LED lighting sheet 20 for plant growth (hereinafter, also referred to as LED lighting sheet 20) and a controller 40 electrically connected to the LED lighting sheet 20.

Figure 2:
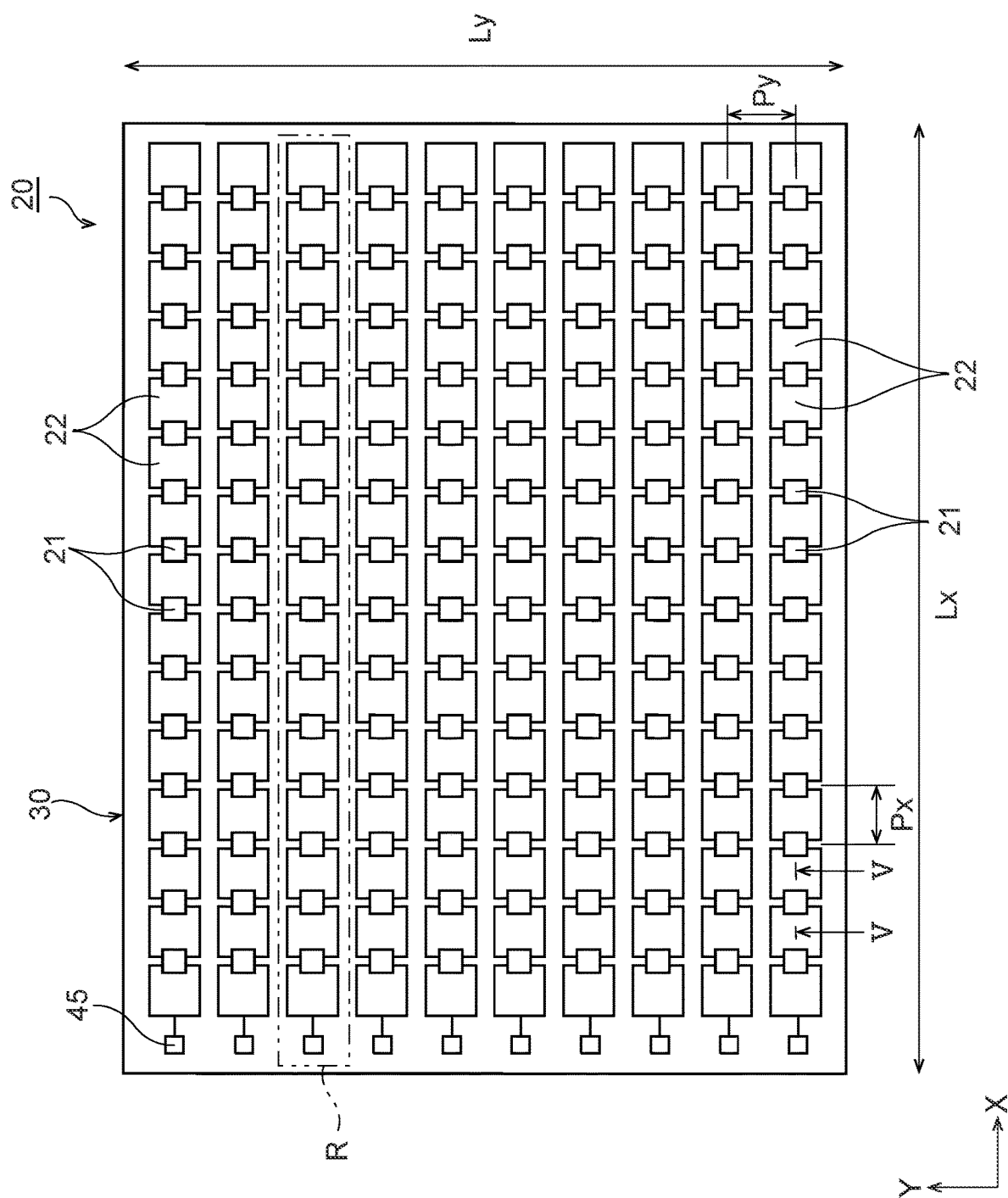
FIG. 2 is a plan view showing an LED lighting sheet according to the embodiment.

As shown in FIG. 2, the LED lighting sheet 20 includes an array of LED chips 21 on a light emitting surface (a side facing plants during usage) of its sheet surfaces. By using the direct LED lighting sheet 20, irradiating light from the LED chips 21 directly passes through the light emitting surface and directly reaches plants immediately, so the growth of plants is facilitated by increasing the amount of light, and a shadow hardly appears to the side of each LED chip 21 by reducing the thickness of the entire sheet. FIG. 2 shows an example of the direct LED lighting sheet 20; however, the configuration is not limited thereto. Alternatively, an edge LED lighting sheet in which a light guide plate or the like is interposed may be used. An edge LED lighting sheet tends to reduce variations in the amount of light from the light emitting surface. The LED lighting sheet 20 of FIG. 2 includes a flexible wiring substrate 30, and the plurality of LED chips 21 regularly arranged on the flexible wiring substrate 30. By using the flexible wiring substrate 30, the LED lighting sheet 20 with a sheet surface having a relatively large area is obtained. Generally, in plant growth factories and plant growth racks, an array of the LED lighting sheets 20 is used; however, when positions between any adjacent two of the LED lighting sheets 20 vary, variations in the amount of light occur, with the result that the yield of plants may decrease. The LED lighting sheet 20 with a sheet surface having a relatively large area can reduce the number of the LED lighting sheets 20 to be used, so variations in the amount of light due to placement of a plurality of the LED lighting sheets 20 are reduced. FIG. 2 shows an example of the LED lighting sheet 20 including the flexible wiring substrate 30; however, the configuration is not limited thereto. Alternatively, an LED lighting sheet including a rigid wiring board may be used. An LED lighting sheet including a rigid wiring board has a high resistance to stress and is hard to break. In FIG. 2, a light reflection insulating protective film 34 and a transparent protective film 35, described later, are not shown.

In this case, the LED chips 21 are arranged in a grid point manner in plan view in the flexible wiring substrate 30. In other words, the LED chips 21 are arranged in a matrix of multiple rows and multiple columns, and N rows of an array R in which the M LED chips 21 are connected in series are arranged. For example, in FIG. 2, the 14 LED chips 21 (M=14) are connected in series along a first array direction (X direction) of the LED chips 21. In addition, the 10 rows R (N=10) of the array R of the 14 LED chips 21 are arranged in parallel along a second array direction (Y direction) of the LED chips 21. The number of the LED chips 21 arranged is not limited thereto. Specifically, it is preferable that the 10 or more and 14 or less (14≥M≥10) LED chips 21 be arranged in series in the first array direction (X direction) and the four or more and 10 or less rows (10≥N≥4) of the array R be arranged in parallel in the second array direction (Y direction) of the LED chips 21. By arranging the 10 or more LED chips 21 in series, the LED chips 21 are arranged at a narrow pitch along the first array direction (X direction), and in-plane variations in the illuminance of the LED lighting sheet 20 are reduced, so variations of light irradiated to plants are reduced. By arranging the 14 or less LED chips 21 in series, power consumption is reduced, so a running cost, such as light and fuel expenses, in the plant growth factory 90 is reduced. By arranging the four or more rows of the LED chips 21 in the second array direction (Y direction) of the LED chips 21 in parallel, even when a specific one or some of the LED chips 21 break, influences on the LED chips 21 in other rows are suppressed, and an excessive decrease in the illuminance of the overall LED lighting sheet 20 is suppressed. By limiting the range in which the illuminance of the LED lighting sheet 20 is decreased, the range in which nonconforming products may occur is limited, with the result that a decrease in yield is suppressed. To obtain the LED lighting sheet 20 that irradiates light having a total luminous flux of 3000 lm or more, the performance of the LED chips 21 needs to be improved. For this reason, limiting the influence of a break of a specific one or some of the LED chips 21 as much as possible is important from the viewpoint of risk management. When the LED lighting sheet 20 is of a direct type, the LED chips 21 may be highly likely to be erroneously touched strongly and broken at the time of installation or cleaning, so it is important to take measures at the time of a break from the viewpoint of risk management. By arranging the 10 or less rows of the LED chips 21 in parallel, power consumption is reduced, so a running cost, such as light and fuel expenses, in the plant growth factory 90 is reduced.

The LED lighting sheet 20 includes a plurality of metal wiring portions 22. The plurality of metal wiring portions 22 is arranged along the first array direction (X direction). The plurality of metal wiring portions 22 arranged along the first array direction (X direction) is in correspondence with each of the rows R of the LED chips 21. Each of the LED chips 21 is placed so as to bridge a pair of the metal wiring portions 22 adjacent to each other in the X direction. The terminals (not shown) of each LED chip 21 are respectively electrically connected to the pair of metal wiring portions 22. The plurality of metal wiring portions 22 makes up a power feeding portion to the LED chips 21. When electric power is supplied to the plurality of metal wiring portions 22, all the LED chips 21 arranged in the row R light up. The plurality of metal wiring portions 22 partially makes up a metal wiring portion 32 (described later).

The pitch Px of the LED chips 21 in the first array direction (X direction) is preferably greater than or equal to 37 mm and less than or equal to 50 mm. The pitch Py of the LED chips 21 in the second array direction (Y direction) is preferably greater than or equal to 37 mm and less than or equal to 100 mm. By setting the pitches of the LED chips 21 to the above ranges, variations of light irradiated to plants are reduced by equalizing the brightness of the LED lighting sheet 20 in the plane, and the power consumption of the LED lighting sheet 20 is reduced.

The thickness of a thickest part in the LED lighting sheet 20 is preferably less than or equal to 5 mm. In this way, by reducing the thickness of the LED lighting sheet 20, a vertical space between boards 81 (FIG. 9) on which the LED lighting sheets 20 are installed can be narrowed. Thus, the number of boards 81 per each plant growth rack 80 (FIG. 9) can be increased. As a result, the crop yield of plants per unit area can be increased. Variations of relatively strong light irradiated to plants when the plants are close to the LED lighting sheet 20 are reduced.

Figure 3A:
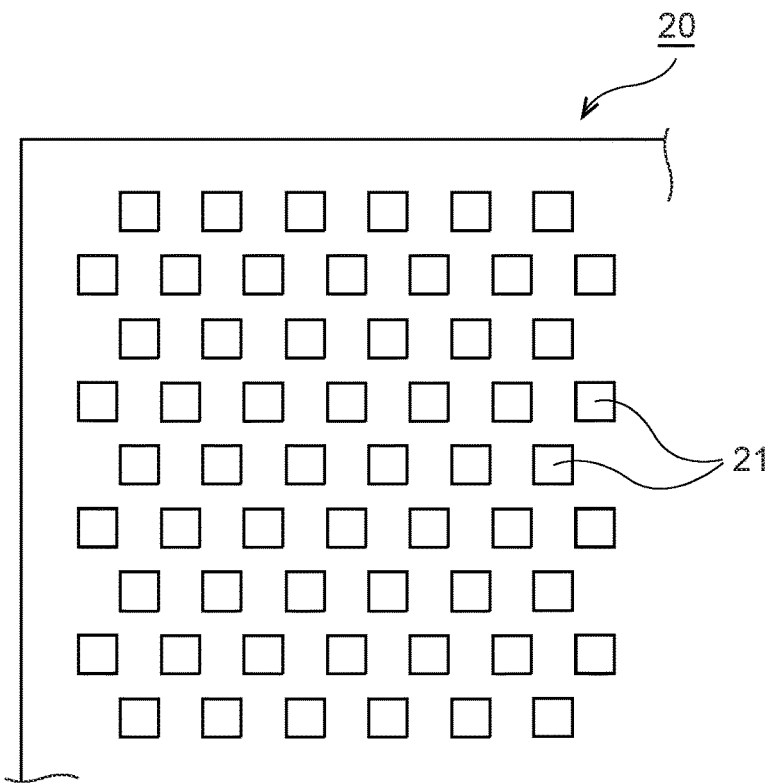
FIG. 3 is a plan view showing a modification of the LED lighting sheet.
Figure 3B:
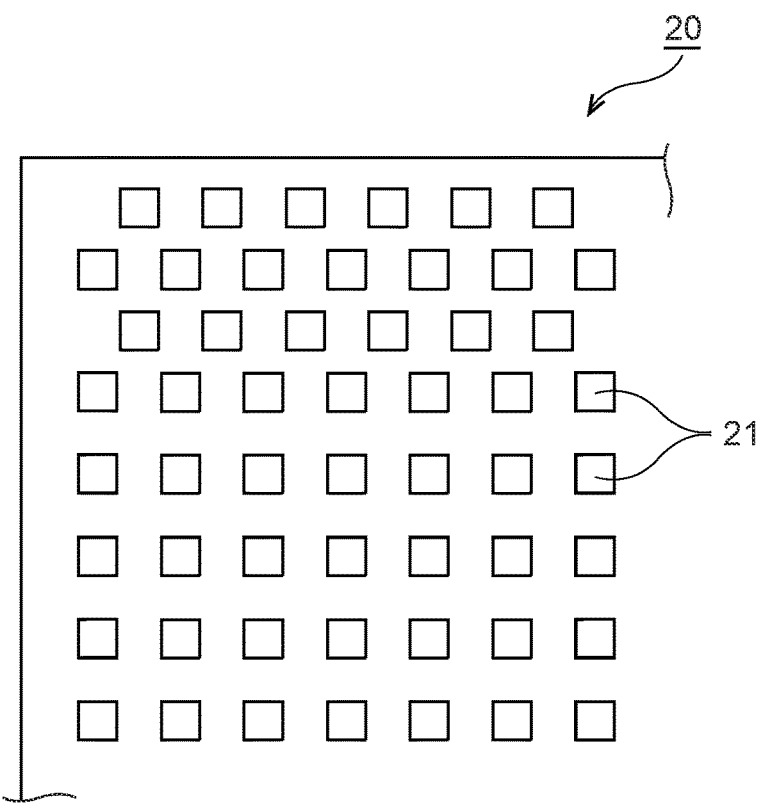

The LED chips 21 are not limited to arrangement in a grid point manner in plan view. Alternatively, as shown in FIG. 3A, the LED chips 21 may be arranged in a staggered manner in plan view. Alternatively, the LED chips 21 do not need to be arranged uniformly in the plane of the LED lighting sheet 20. For example, the density of the LED chips 21 may be increased at the peripheral part of the LED lighting sheet 20. Specifically, as shown in FIG. 3B, the LED chips 21 may be arranged in a grid point manner at the center part (the lower part in FIG. 3B) of the LED lighting sheet 20, and the LED chips 21 may be arranged in a staggered manner at the peripheral part (the upper part in FIG. 3B) of the LED lighting sheet 20. Thus, a decrease in the brightness of the LED lighting sheet 20 at the peripheral part of the LED lighting sheet 20 is suppressed, and variations of light irradiated to plants are reduced by equalizing the brightness of the LED lighting sheet 20 in the plane.

The overall shape of the LED lighting sheet 20 is a rectangular shape in plan view; however, the size and planar shape of the LED lighting sheet 20 are not limited. The LED lighting sheet 20 has a high degree of flexibility in size and shape processing, the LED lighting sheet 20 is able to flexibly meet various demands in terms of these points. By taking advantage of the flexibility, the LED lighting sheet 20 can be attached to not only a flat installation surface but also installation surfaces of various shapes.

In FIG. 2, the length Lx of the LED lighting sheet 20 in the first array direction (X direction) is preferably greater than or equal to 500 mm and less than or equal to 700 mm and more preferably greater than or equal to 550 mm and less than or equal to 650 mm. The length Ly of the LED lighting sheet 20 in the second array direction (Y direction) is preferably greater than or equal to 300 mm and less than or equal to 500 mm and more preferably greater than or equal to 350 mm and less than or equal to 450 mm. By setting the size of the LED lighting sheet 20 within the above ranges, the LED lighting sheet 20 can be adapted to the general board 81 (FIG. 9) for plant cultivation, so the dead space of the board 81 is reduced. Because of the fact that the size of each individual LED lighting sheet 20 is not excessively large, when a specific one or some of the LED chips 21 break, influences on the other LED chips 21 are minimized, an extreme decrease in the illuminance of the shelf as a whole is prevented, and the range in which the illuminance decreases is limited.

Figure 4:
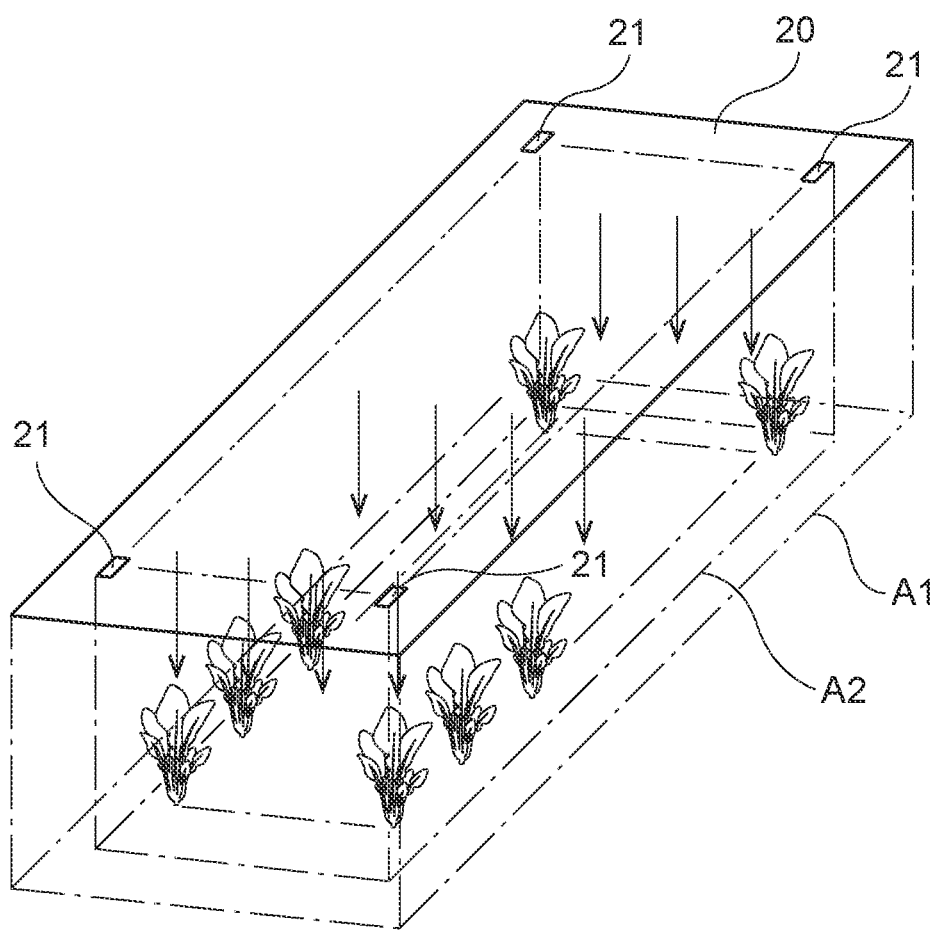
FIG. 4 is a schematic perspective view showing a state where light is irradiated downward from the LED lighting sheet.

In the present embodiment, at any location 200 mm away from the LED chips 21 in the lower region below the LED lighting sheet 20, a PPFD (photosynthetic photon flux density) from the LED lighting sheet 20, converted by input power and normalized by an average value over the lower region, is preferably greater than or equal to 0.3 and more preferably greater than or equal to 0.4. In the present embodiment, the lower region below the LED lighting sheet 20 means the region A1 included in the LED lighting sheet 20 when viewed from above in the vertical direction of the LED lighting sheet 20 as shown in FIG. 4. Here, a PPFD converted by input power means a value obtained by dividing each actually measured value ($\mu mol \cdot m^{-2} \cdot s^{-1}$) of photosynthetic photon flux density PPFD from the LED lighting sheet 20 by electric power (W) input to the LED lighting sheet 20. A value normalized by an average value over the lower region means a value obtained by dividing a value of PPFD converted by input power at each location in the lower region by the average value of PPFDs converted by input power at multiple locations in the lower region.

When a PPFD at any location 200 mm away from the LED chips 21 is set within the above range, the amount of light needed for growth of plants is sufficiently provided in the plant growth factory 90, and the growth of plants is accelerated. Particularly, the amount of light needed for growth of plants in a late growth stage of plants is sufficiently provided. A PPFD can be measured with a measuring instrument, such as a quantameter (for example, Quantum sensor LI-190R and Light meter LI-250A produced by LI-COR, Inc. U.S.). Quantum sensor LI-190R is placed horizontally with respect to a cultivation surface (or a light source), discretely arranged in a matrix according to a cultivation area, and numeric values are read in a state where figures indicating the amounts of light are stable. Reading of numeric values is performed in a state of being calibrated to eigenvalues of the sensor with Light meter. In the present embodiment, a numeric value of PPFD is expressed by numeric values measured in the matrix.

At any location 50 mm away from the LED chips 21 in the lower region below the LED lighting sheet 20, a PPFD (photosynthetic photon flux density) from the LED lighting sheet 20 is converted by input power and normalized by an average value over the lower region is preferably greater than or equal to 0.2.

In this way, when a PPFD at any location 50 mm away from the LED chips 21 is set within the above range, the amount of light particularly needed for growth of plants in a late growth stage of plants is sufficiently provided, and the growth of plants is accelerated.

In the present embodiment, a variation in photosynthetic photon flux densities (PPFDs) respectively measured at a plurality of locations 50 mm away from the LED chips 21 in the lower region below the LED lighting sheet 20 is preferably less than or equal to 0.5 and more preferably less than or equal to 0.4 in standard deviation when normalized by the average value. Here, a variation in PPFDs means a value normalized by taking a quotient by using an average value of the PPFDs (after being converted by input power) respectively measured in the range and expressed in standard deviation.

Generally, in the chip array region of the LED lighting sheet 20, the PPFD takes a maximum value immediately below each LED chip 21 and takes a minimum value at an intermediate location between the adjacent LED chips 21. In the present embodiment, the chip array region of the LED lighting sheet 20 means the region A2 surrounded by the outermost LED chips 21 when viewed from above in the vertical direction of the LED lighting sheet 20 as shown in FIG. 4.

In this way, by reducing a variation in PPFDs at locations close to the LED chips 21 (that is, locations 50 mm away from the LED chips 21), the amount of light from the LED chips 21 is equalized below the LED lighting sheet. In this way, when a variation in PPFDs is reduced, the amount of light irradiated from the LED chips 21 is equal in the plane, with the result that a place where the amount of light irradiated is insufficient is eliminated in the lower region below the LED lighting sheet 20. With this configuration, the growth speeds of plants are equalized in the plane. A place where the amount of light irradiated from the LED chips 21 is excessive disappears, so an occurrence of growth impairment called tip burn in plants is reduced. As a result, variations in the growth of plants are hard to occur, so a decrease in the yield of plants is suppressed.

Next, the controller 40 will be described. As shown in FIG. 1, the controller 40 supplies electric power to the LED lighting sheet 20 and controls light emission and the like of the LED lighting sheet 20. The controller 40 is detachably connected to the LED lighting sheet 20 via a first connector 44A provided on the LED lighting sheet 20. In other words, the controller 40 is provided separately from the LED lighting sheet 20 and is externally connected to the LED lighting sheet 20. In other words, the controller 40 is not integrated with the LED lighting sheet 20. With this configuration, the controller 40 that is a heat source can be isolated from the LED lighting sheet 20, so heat from the controller 40 does not to influence the growth of plants.

The controller 40 includes a power input section 41, an AC/DC converter (driver) 42, and a PWM control section 43. Of these, for example, alternating-current voltage having a selected voltage of 100 V to 240 V is supplied to the power input section 41. The AC/DC converter 42 converts the alternating-current voltage of 100 V to 240 V to a constant direct-current voltage (for example, 44 V). The PWM control section 43 controls the lighting of the LED chips 21 of the LED lighting sheet 20 by changing the pulse width of a constant voltage waveform from the AC/DC converter 42 to a selected width. In other words, the PWM control section 43 also plays a role as a light control section that controls the lighting of the LED lighting sheet 20. The constant voltage output from the PWM control section 43 is applied to the LED lighting sheet 20 via the first connector 44A.

Figure 5A:
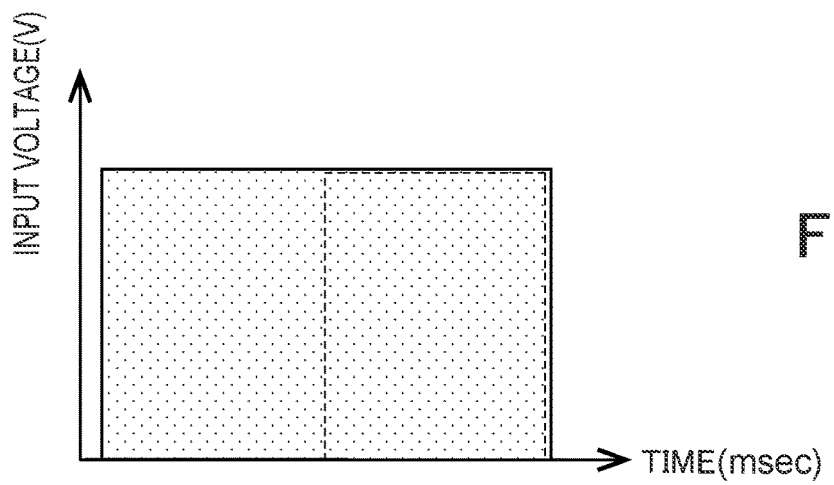
FIG. 5A is a graph showing the relationship between time and voltage in the case where a constant voltage is applied from a controller to the LED lighting sheet.

When the constant voltage is applied from the PWM control section 43 of the controller 40 to the LED lighting sheet 20, the lighting of the LED chips 21 can be controlled unlike the case where a rectified pulse voltage is directly applied to the LED lighting sheet 20. In other words, the PWM control section 43 is capable of controlling the illuminance of the LED chips 21 to a selected illuminance by changing the duty ratio of the direct-current voltage from the AC/DC converter 42 as needed. For example, as shown in FIG. 5A, the PWM control section 43 is capable of reducing the illuminance of the LED chips 21 by reducing the duty ratio of the constant voltage from the AC/DC converter 42 from 100% (continuous line) to 50% (dashed line).

By adjusting the illuminance of the LED chips 21 as needed in this way, the degree of growth of plants can be adjusted by adjusting the illuminance of the LED lighting sheet 20 according to a plant growth stage. For example, the illuminance of the LED lighting sheet 20 may be reduced in an early growth stage in which the leaves of plants are small, and the illuminance of the LED lighting sheet 20 may be increased in a late growth stage where the leaves of plants are large. Alternatively, the illuminance of the LED lighting sheet 20 may be increased in an early growth stage where the heights of plants are low because the distance between plants and the LED chips 21 is long, and the illuminance of the LED lighting sheet 20 may be reduced in a late growth stage where the heights of plants are high because the distance between plants and the LED chips 21 is short. As another example of adjusting the illuminance of the LED lighting sheet 20, the illuminance may be increased in the case of types of plants that need a high illuminance, and the illuminance may be reduced in the case of types of plants that can be grown even at a low illuminance. The illuminance may be increased when shipping timing needs to be advanced, and the illuminance may be reduced when shipping timing needs to be delayed. The LED lighting sheet 20 that irradiates light having a total luminous flux of 3000 lm or more has a wide adjustable range of illuminance, so there is a big advantage of making it possible to control the lighting of the LED chips 21. In the case of the LED lighting sheet 20 having a low amount of light, even when a light control function is imparted, the LED lighting sheet 20 is eventually used at an illuminance around the maximum, so there is a small advantage of having a light control function.

Figure 5B:
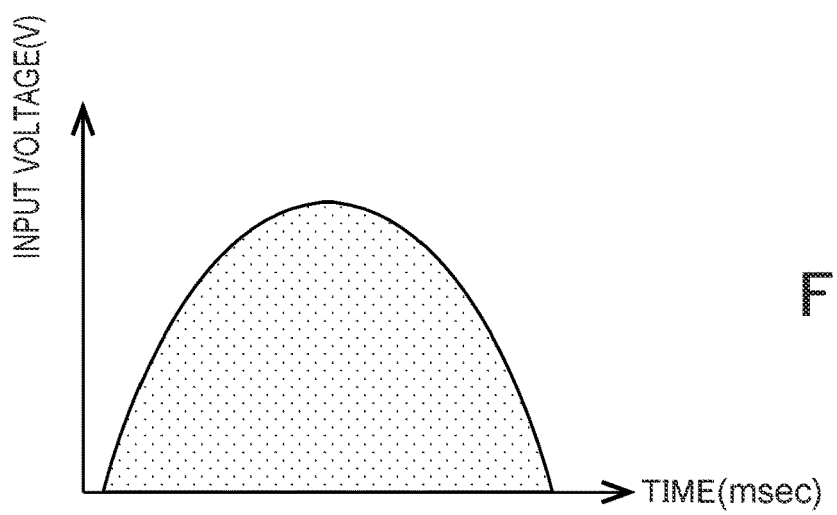
FIG. 5B is a graph showing the relationship between time and voltage in the case where a pulse is applied to the LED lighting sheet as a comparative example.

When the constant voltage is applied from the PWM control section 43 to the LED lighting sheet 20, an accumulated amount of light per unit time of light from the LED lighting sheet 20 can be increased. In other words, for example, an accumulated amount of light (the area of a shaded part in FIG. 5A) in the case where the constant voltage is applied to the LED lighting sheet 20 can be increased as compared to an accumulated amount of light (the area of a shaded part in FIG. 5B) in the case where a voltage is applied in pulse as a comparative example. With this configuration, the luminous efficiency of light from the LED lighting sheet 20 is enhanced, and the growth efficiency of plants is improved.

Referring again to FIG. 1, the LED lighting sheet 20 includes regulators 45. In this case, the regulators 45 are respectively provided in correspondence with the rows of the LED chips 21, and specifically the 10 regulators 45 are provided in correspondence with the 10 rows of the LED chips 21. Each of the regulators 45 plays a role in maintaining a constant current flowing through the plurality of LED chips 21 of the associated row. With this configuration, even when one of the LED chips 21 breaks, flow of an excessive current through the LED chips 21 in other rows is suppressed, so a break of the LED chips 21 in other rows is prevented. As a result, an extreme decrease in the illuminance of the overall LED lighting sheet 20 is prevented, so variations of light irradiated to plants are reduced. The regulators 45 are capable of controlling the amounts of current controlled by connected resistance values row by row and, are capable of increasing output power only in the rows at peripheral parts by, for example, changing the controlling resistance values for the first row and the last row. With this configuration, normally, uniformity is intended to be ensured by spreading the LED lighting sheets 20 without any gap; however, even when the LED lighting sheets 20 are placed with a spacing of about 5 cm to about 10 cm from the viewpoint of cost and the viewpoint of ensuring ventilation, the effect of eliminating the joint is expected.

Furthermore, the LED lighting sheet 20 includes a power supply line 46 that branches off from the first connector 44A. A second connector 44B is provided on the LED lighting sheet 20. The power supply line 46 is not electrically connected to the LED chips 21 of the LED lighting sheet 20 and is electrically connected to wires of another LED lighting sheet 200 having the same configuration as the LED lighting sheet 20. In other words, the power supply line 46 is detachably connected to the wires of the another LED lighting sheet 200 via the second connector 44B and another first connector 44A provided on the another LED lighting sheet 200. The other connector 44A is connected to another LED lighting sheet 20 having the same configuration. A current from the power supply line 46 is supplied to the another LED lighting sheet 20 via the second connector 44B and the another first connector 44A. With this configuration, the two LED lighting sheets 20 can be coupled, and these two LED lighting sheets 20, 200 can be controlled at the same time by the single controller 40. Since the single controller 40 is capable of controlling the plurality of LED lighting sheets 20, 200 at the same time, the number of the controllers 40 that are heat generating sources is reduced. Therefore, variations in the growth of plants due to heat from the controller 40 are hard to occur, so a decrease in yield is suppressed.

Members of LED Lighting Sheet

Figure 6:
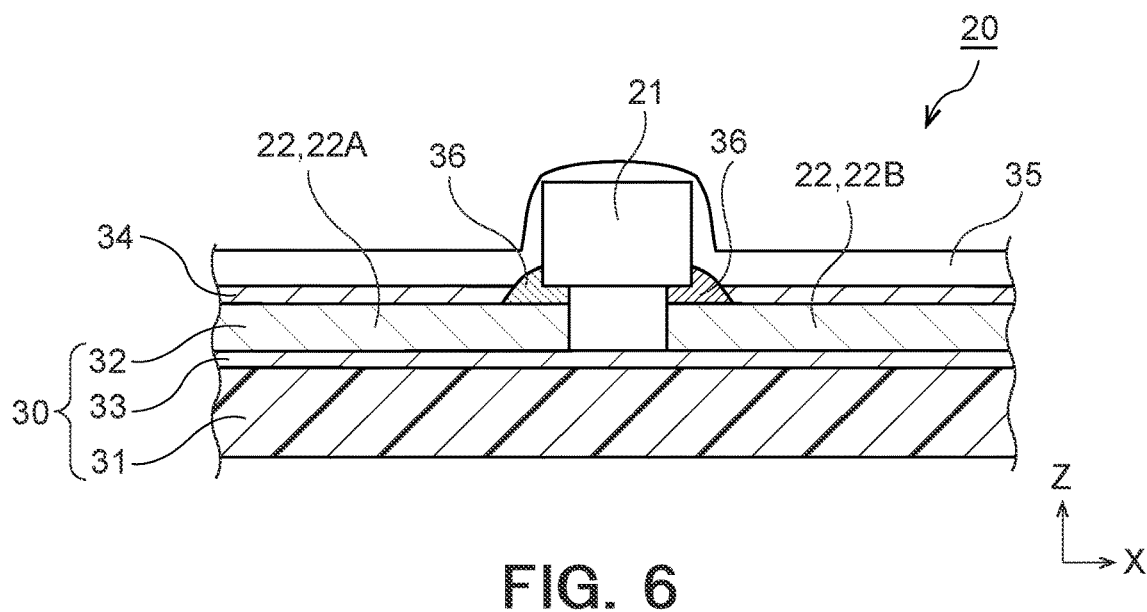
FIG. 6 is a sectional view (sectional view taken along the line V-V in FIG. 2) showing the LED lighting sheet according to the embodiment.

Next, members that make up the LED lighting sheet 20 will be described. As shown in FIG. 6, the LED lighting sheet 20 includes the flexible wiring substrate 30, and the plurality of LED chips 21 placed on the flexible wiring substrate 30. Of these, the flexible wiring substrate 30 has a substrate film 31 having flexibility, and the metal wiring portion 32 formed on the surface (the light emitting surface side) of the substrate film 31. The metal wiring portion 32 is laminated on the substrate film 31 via an adhesive layer 33.

Each of the LED chips 21 is implemented so as to be able to conduct to the metal wiring portion 32. In the LED lighting sheet 20, since the LED chips 21 are implemented on the flexible wiring substrate 30, the plurality of LED chips 21 can be placed with a desired high density.

The light reflection insulating protective film 34 is formed so as to cover the LED lighting sheet 20 in a region, other than the region in which the LED chips 21, the regulators 45, and the connectors 44A, 44B are provided or their peripheral regions. The light reflection insulating protective film 34 is placed so as to cover the metal wiring portion 32. The light reflection insulating protective film 34 is a layer having an electrically insulating function that contributes to improvement in the migration resistance properties of the LED lighting sheet 20 and a light reflection function that contributes to improvement in light environment created by the LED lighting sheet 20. This layer is made of an electrically insulating resin composition containing a white pigment. When the migration resistance properties and the light reflection function are obtained only with the metal wiring portion 32 and the transparent protective film 35 (described later), a structure with no light reflection insulating protective film 34 is possible.

The transparent protective film 35 is formed so as to cover the light reflection insulating protective film 34 and the LED chips 21. The transparent protective film 35 is a resin film formed at the outermost surface (the surface closest to the light emitting surface side) of the LED lighting sheet 20 to mainly ensure the waterproofness of the LED lighting sheet 20.

Solder portions 36 are provided on the metal wiring portion 32. Each of the LED chips 21 is electrically connected to the metal wiring portion 32 via the solder portions 36.

Substrate Film

A resin film having flexibility may be used as the substrate film 31. In the specification, the phrase "having flexibility" means "to be bendable to a radius of curvature of at least less than or equal to 1 m, preferably 50 cm, more preferably 30 cm, further preferably 10 cm, and particularly preferably 5 cm".

A high heat resistant, electrically insulating thermoplastic resin may be used as the material of the substrate film 31. A polyimide resin (PI) or polyethylene naphthalate (PEN) having high heat resistance, dimensional stability during heating, mechanical strength, and durability may be used as such a resin. Of these polyethylene naphthalate (PEN) having improved heat resistance and dimensional stability imparted through a heat resistance improving treatment, such as annealing, may be preferably used. Polyethylene terephthalate (PET) having improved flame resistance imparted by adding a flame-resistant inorganic filler or the like may be used.

The thickness of the substrate film 31 is not limited and is preferably greater than or equal to about 10 μm and less than or equal to about 500 μm and more preferably greater than or equal to 50 μm and less than or equal to 250 μm from the viewpoint that the substrate film 31 does not become a bottleneck as a heat dissipation path and has heat resistance and electrical insulation properties, and a balance with a manufacturing cost. From the viewpoint of maintaining good productivity in the case of manufacturing by a roll-to-roll process as well, the thickness preferably falls within the above range.

Adhesive Layer

Known resin adhesives may be used as needed for an adhesive that forms the adhesive layer 33. Of those resin adhesives, a urethane adhesive, a polycarbonate adhesive, a silicone adhesive, an ester adhesive, an epoxy adhesive, or the like may be particularly preferably used. An acrylic adhesive agent may be used for an adhesive that forms the adhesive layer 33.

Metal Wiring Portion

The metal wiring portion 32 is a wiring pattern formed on the surface (the light emitting surface side) of the substrate film 31 from a conductive base material, such as metal foil. The metal wiring portion 32 is preferably formed on the surface of the substrate film 31 via the adhesive layer 33 by dry lamination. The metal wiring portion 32 includes the above-described plurality of metal wiring portions 22. The plurality of metal wiring portions 22 includes a first metal wiring portion 22A and a second metal wiring portion 22B placed apart from the first metal wiring portion 22A. The LED chip 21 is mounted on the first metal wiring portion 22A and the second metal wiring portion 22B, and the LED chip 21 is electrically connected to the first metal wiring portion 22A and the second metal wiring portion 22B. The LED chip 21 lights up by electric power supplied to the first metal wiring portion 22A and the second metal wiring portion 22B.

The metal wiring portion 32 is preferably the one that achieves both heat dissipation and electrical conductivity at a high level, and, for example, copper foil may be used. In this case, heat dissipation from the LED chips 21 is stable and an increase in electrical resistance is suppressed, so light emission variations among the LED chips 21 reduce, with the result that stable light emission is possible. The life of the LED chips 21 is also extended. Degradation of peripheral members including the substrate film 31 and the like due to heat is also suppressed, so the product life of the LED lighting sheet 20 is also extended. Examples of the metal that forms the metal wiring portion 32 include metals, such as aluminum, gold, and silver, in addition to the above-described copper.

The thickness of the metal wiring portion 32 may be set as needed according to, for example, the magnitude of withstand current required from the flexible wiring substrate 30. To suppress warpage caused by heat shrinkage of the substrate film 31 during reflow soldering process or the like, the thickness of the metal wiring portion 32 is preferably greater than or equal to 10 μm. On the other hand, the thickness of the metal wiring portion 32 is preferably less than or equal to 50 μm. With this configuration, sufficient flexibility of the flexible wiring substrate 30 is maintained, so a decrease in handling or the like due to an increase in weight is also suppressed.

Solder Portion

The solder portions 36 join the metal wiring portion 32 with the LED chips 21. Joining with solder may be performed with any one of two methods, that is, a reflow method and a laser method.

LED Chip

The LED chip 21 is a light-emitting element that uses light emission at a p-n junction part at which a p-type semiconductor and an n-type semiconductor are joined together. The LED chip 21 may have a structure such that a p-type electrode and an n-type electrode are respectively provided at the upper and lower surfaces of an element or may have a structure such that both a p-type electrode and an n-type electrode are provided at one side of an element.

In the present embodiment, the one having a high luminous flux is preferably used as each of the LED chips 21. Specifically, the one having a luminous flux of 30 lm or more is preferably used as the LED chip 21, and the one having a luminous flux of 35 lm or more is more preferably used as the LED chip 21. The one having high luminous efficiency is preferably selected as the LED chip 21. Specifically, the one having a luminous efficiency of 150 lm/W or higher is preferably used as the LED chip 21, and the one having a luminous efficiency of 180 lm/W or higher is more preferably used as the LED chip 21. When the luminous efficiency of the LED chip 21 is increased to 150 lm/W or higher, the number (density) of LED chips 21 implemented can be reduced, and heat generation due to Joule heat from the LED chips 21 can be reduced, so variations in the growth of plants due to heat from the LED chips 21 are hard to occur, with the result that a decrease in yield is suppressed.

The LED lighting sheet 20 is the one in which the LED chips 21 are directly implemented on the metal wiring portion 32 capable of exercising high heat dissipation as described above. With this configuration, even in the case where the LED chips 21 are placed in high density, excessive heat to be generated during lighting of the LED chips 21 is rapidly diffused through the metal wiring portion 32 and sufficiently dissipated to the outside of the LED lighting sheet 20 via the substrate film 31, so variations in the growth of plants due to heat from the LED chips 21 are hard to occur, with the result that a decrease in yield is suppressed.

Light Reflection Insulating Protective Film

The light reflection insulating protective film 34 is a layer formed in a region, other than the region in which the LED chips 21 are provided or their peripheral regions. The light reflection insulating protective film 34 is a so-called resist layer to improve the migration resistance properties of the flexible wiring substrate 30 with sufficient electrical insulation properties and is also a light reflection layer having light reflectivity that contributes to improvement in light environment created by the LED lighting sheet 20.

The light reflection insulating protective film 34 may be formed by using various resin compositions having a urethane resin or the like as a base resin and further containing a white pigment made up of an inorganic filler, such as titanium oxide. Other than a urethane resin, an acrylic urethane resin, a polyester resin, a phenolic resin, or the like may be used as the base resin of the resin composition used to form the light reflection insulating protective film 34. For the base resin of the resin composition that forms the light reflection insulating protective film 34, the same or same-series resin as the resin composition that forms the transparent protective film 35 is preferably used as the base resin. For the transparent protective film 35, an acrylic urethane resin is preferably used as a main material resin as will be described later. Thus, when the base resin of the resin composition that forms the transparent protective film 35 is an acrylic urethane resin, the base resin of the resin composition for forming the light reflection insulating protective film 34 is more preferably a urethane resin or an acrylic urethane resin.

In addition to titanium oxide, at least one selected from among alumina, barium sulfate, magnesia, aluminum nitride, boron nitride, barium titanate, kaolin, talc, calcium carbonate, zinc oxide, silica, mica powder, granulated glass, powdered nickel, and powdered aluminum may be used as the inorganic filler to be contained as a white pigment in the resin composition that forms the light reflection insulating protective film 34.

The thickness of the light reflection insulating protective film 34 is greater than or equal to 5 μm and less than or equal to 50 μm and more preferably greater than or equal to 7 μm and less than or equal to 20 μm. When the thickness of the light reflection insulating protective film 34 is less than 5 μm, the light reflection insulating protective film is thin particularly at an edge part of the metal wiring portion 32. When the metal wires are not covered and exposed, the risk of not maintaining electrical insulation properties increases. On the other hand, from the viewpoint of holding the light reflection insulating protective film 34 against a bend of the substrate at the time of handling, conveyance, or the like, the thickness of the light reflection insulating protective film 34 is preferably less than or equal to 50 μm.

At wavelengths of greater than or equal to 400 nm and less than or equal to 780 nm, the average light reflectance of the light reflection insulating protective film 34 is preferably higher than or equal to 65%, more preferably higher than or equal to 70%, and further preferably higher than or equal to 80% in any case. In the LED lighting sheet 20, for example, by containing 20 parts by mass or more of titanium oxide for 100 parts by mass of urethane or acrylic urethane base resin, the light reflectance of the layer in the case where the thickness of the light reflection insulating protective film 34 is set to 8 μm can be higher than or equal to 75%.

Transparent Protective Film

The transparent protective film 35 is formed at the outermost surface of the LED lighting sheet 20 so as to cover the LED chips 21. The transparent protective film 35 has waterproofness and transparency. With the waterproofness of the transparent protective film 35, entry of water into the unit in the case where the LED lighting sheet 20 is used as a plant growth light source is prevented. In the LED lighting sheet 20 that irradiates light having a total luminous flux of 3000 lm or more, the performance of the LED chips 21 needs to be improved, and influences in the case of a break of a specific one or some of the LED chips 21 are large. For this reason, making the LED chips 21 hard to break as much as possible is important from the viewpoint of risk management.

The transparent protective film 35 may be formed by using various resin compositions having an acrylic urethane resin or the like as a base resin. Other than an acrylic urethane resin, a urethane resin, a polyester resin, a phenolic tree, or the like may be used as the base resin of the resin composition used to form the transparent protective film 35. For the base resin of the resin composition that forms the transparent protective film 35, the same or same-series resin as the resin composition that forms the light reflection insulating protective film 34 is preferably used as the base resin. Preferred specific combinations may include a combination of a urethane resin as the base resin of the resin composition that forms the light reflection insulating protective film 34 and an acrylic urethane resin as the resin that forms the transparent protective film 35.

The thickness of the transparent protective film 35 is greater than or equal to 10 μm and less than or equal to 40 μm, preferably greater than or equal to 15 μm and less than or equal to 30 μm, and more preferably greater than or equal to 20 μm and less than or equal to 25 μm. By setting the thickness of the transparent protective film 35 within the above range, the good flexibility and thinness, lightweight properties, and good optical characteristics desired for plant growth application, of the LED lighting sheet 20 are maintained. In addition, sufficient waterproofness desired for plant growth application is obtained for the LED lighting sheet 20.

The water resistance of the LED lighting sheet 20 from the transparent protective film 35 is not limited as long as degradation of the LED chips 21 is suppressed when water for plant growth is sprayed to the LED lighting sheet 20. Such water resistance preferably exhibits IPX4 or higher in the waterproof and dustproof standards stipulated by IEC (International Electrotechnical Commission). Waterproofness higher than or equal to IPX4 is a level to which water splashes against the LED chips 21 from any direction have no harmful effect. Specifically, the level is such that water sprayed over all the range of ±180° with respect to the direction normal to the LED lighting sheet 20 for five minutes at a water volume of 10 liters per minute has no harmful effect on the LED chips 21.

Manufacturing Method for LED Lighting Sheet

Next, a manufacturing method for the LED lighting sheet 20 according to the present embodiment will be described with reference to FIG. 7A to FIG. 7H.

Figure 7A:
FIG. 7A to FIG. 7H are sectional views showing a manufacturing method for the LED lighting sheet according to the embodiment.
Figure 7B:
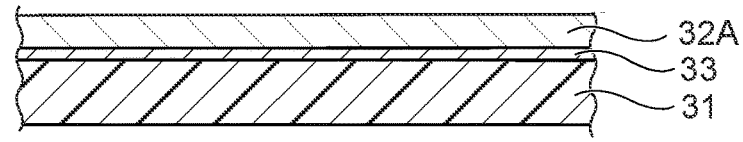

Initially, the substrate film 31 is prepared (FIG. 7A). Subsequently, metal foil 32A, such as copper foil, which is the material of the metal wiring portion 32, is laminated on the surface of the substrate film 31 (FIG. 7B). The metal foil 32A is bonded to the surface of the substrate film 31 by the adhesive layer 33 of, for example, a urethane adhesive or the like. Alternatively, the metal foil 32A may be directly formed on the surface of the substrate film 31 by electrolytic plating or vapor deposition (sputtering, ion plating, electron-beam evaporation, vacuum evaporation, chemical vapor deposition, or the like). Alternatively, the substrate film 31 may be directly deposited on the metal foil 32A.

Figure 7C:
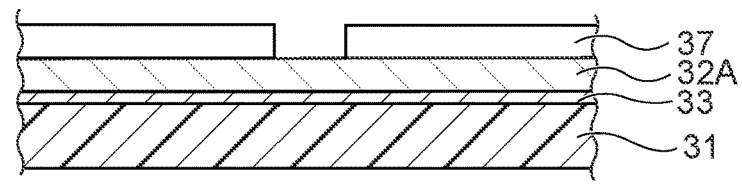

After that, an etching mask 37 patterned in a shape required for the metal wiring portion 32 is formed on the surface of the metal foil 32A (FIG. 7C). The etching mask 37 is provided such that a part corresponding to the wiring pattern of the metal foil 32A, which becomes the metal wiring portion 32, does not corrode with etchant. A method of forming the etching mask 37 is not limited. For example, a photoresist or a dry film may be exposed to light through a photomask and then developed, or an etching mask may be formed on the surface of the metal foil 32A by a printing technology of an ink-jet printer or the like.

Figure 7D:
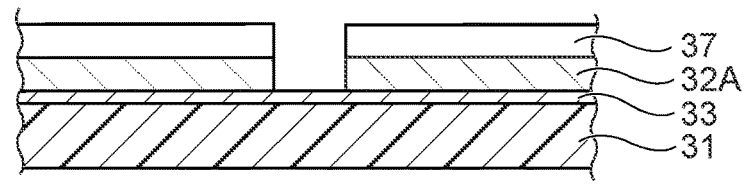

Subsequently, the metal foil 32A at locations not covered with the etching mask 37 is removed by immersion liquid (FIG. 7D). As a result, a part other than the part to be the metal wiring portion 32 in the metal foil 32A is removed.

Figure 7E:
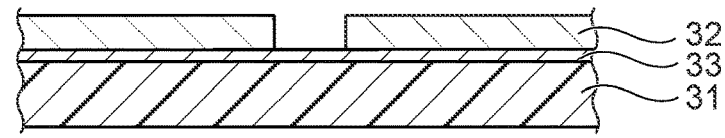

After that, the etching mask 37 is removed by using alkaline stripper to remove the etching mask 37. As a result, the etching mask 37 is removed from the surface of the metal wiring portion 32 (FIG. 7E).

Figure 7F:
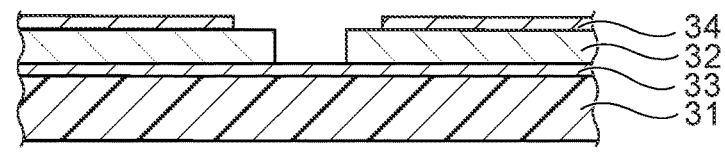

Subsequently, the light reflection insulating protective film 34 is laminated on the metal wiring portion 32 (FIG. 7F). Formation of the light reflection insulating protective film 34 is not limited as long as a coating method is capable of uniformly coating a material resin composition that makes up the light reflection insulating protective film 34, and, for example, a method, such as screen printing, offset printing, dip coater, and brush coating, may be used. Alternatively, the light reflection insulating protective film 34 may be formed by coating an insulating protective film material having photosensitivity over the entire surface, exposing only necessary portions to light through a photomask, and then developing.

Figure 7G:
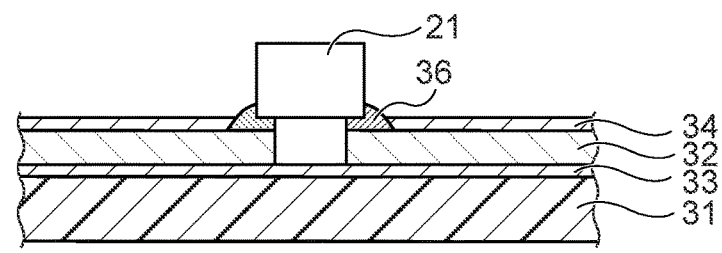

After that, the LED chips 21, the regulators 45, and the connectors 44A, 44B are implemented on the metal wiring portion 32 (FIG. 7G). In this case, each LED chip 21 is joined with the metal wiring portion 32 via the solder portions 36 by soldering. Joining by soldering may be performed by a reflow method or a laser method or may be joining with a conductive resin.

Figure 7H:
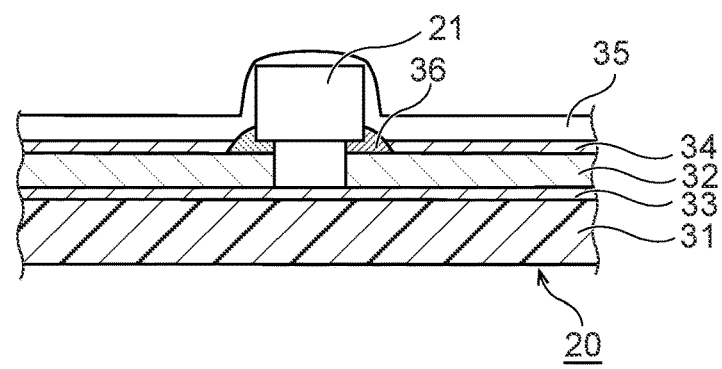

Subsequently, the transparent protective film 35 is formed so as to cover the light reflection insulating protective film 34, the LED chips 21, the regulators 45, and the connectors 44A, 44B (FIG. 7H). The transparent protective film 35 is preferably formed by a formation method by spraying a transparent resin composition by spraying (hereinafter, referred to as spray coating) or a formation method by curtain coating. Formation of the transparent protective film 35 by spray coating can be performed in a manner such that, for example, a coating film is formed by spraying coating liquid containing acrylic polyurethane resin to a desired region on the flexible wiring substrate 30 with a spray coater. Formation of the transparent protective film 35 by curtain coating can be performed in a manner such that, for example, a coating film is formed by dripping curtain coating liquid containing acrylic polyurethane resin to a desired region on the flexible wiring substrate 30 with a curtain coater.

Not limited to the above-described methods, the LED lighting sheet 20 according to the present embodiment can be manufactured by known methods of manufacturing an existing known flexible wiring substrate for LED chips or various LED modules formed by implementing LED chips on the flexible wiring substrate.

Plant Growth Factory and Plant Growth Rack

Figure 8:
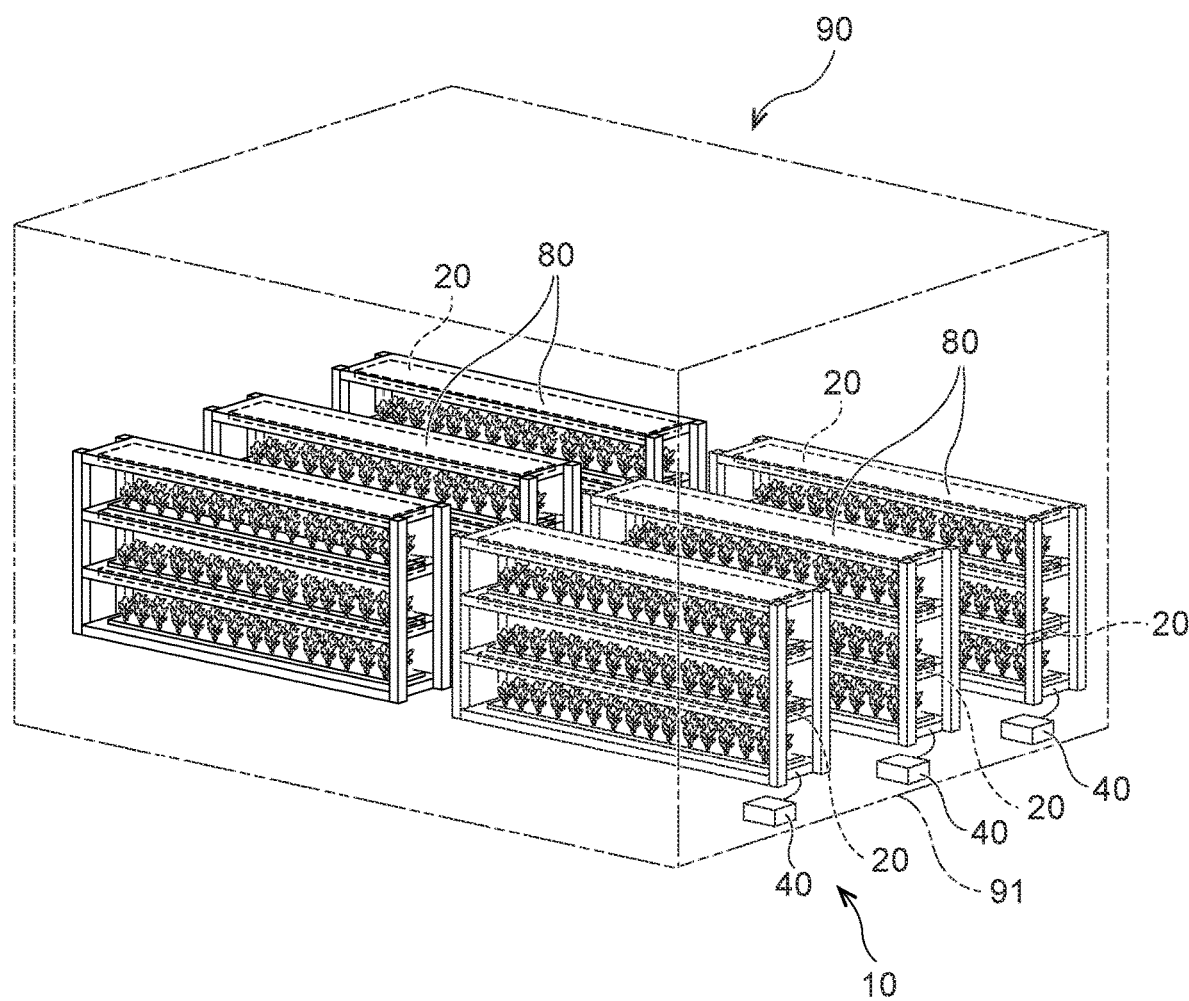
FIG. 8 is a schematic perspective view showing a plant growth factory according to the embodiment.

FIG. 8 is a view schematically showing the configuration of the plant growth factory 90 using the LED lighting sheets 20 according to the present embodiment. The plant growth factory 90 includes a building 91 and a plurality of plant growth racks 80 placed in the building 91.

Figure 9:
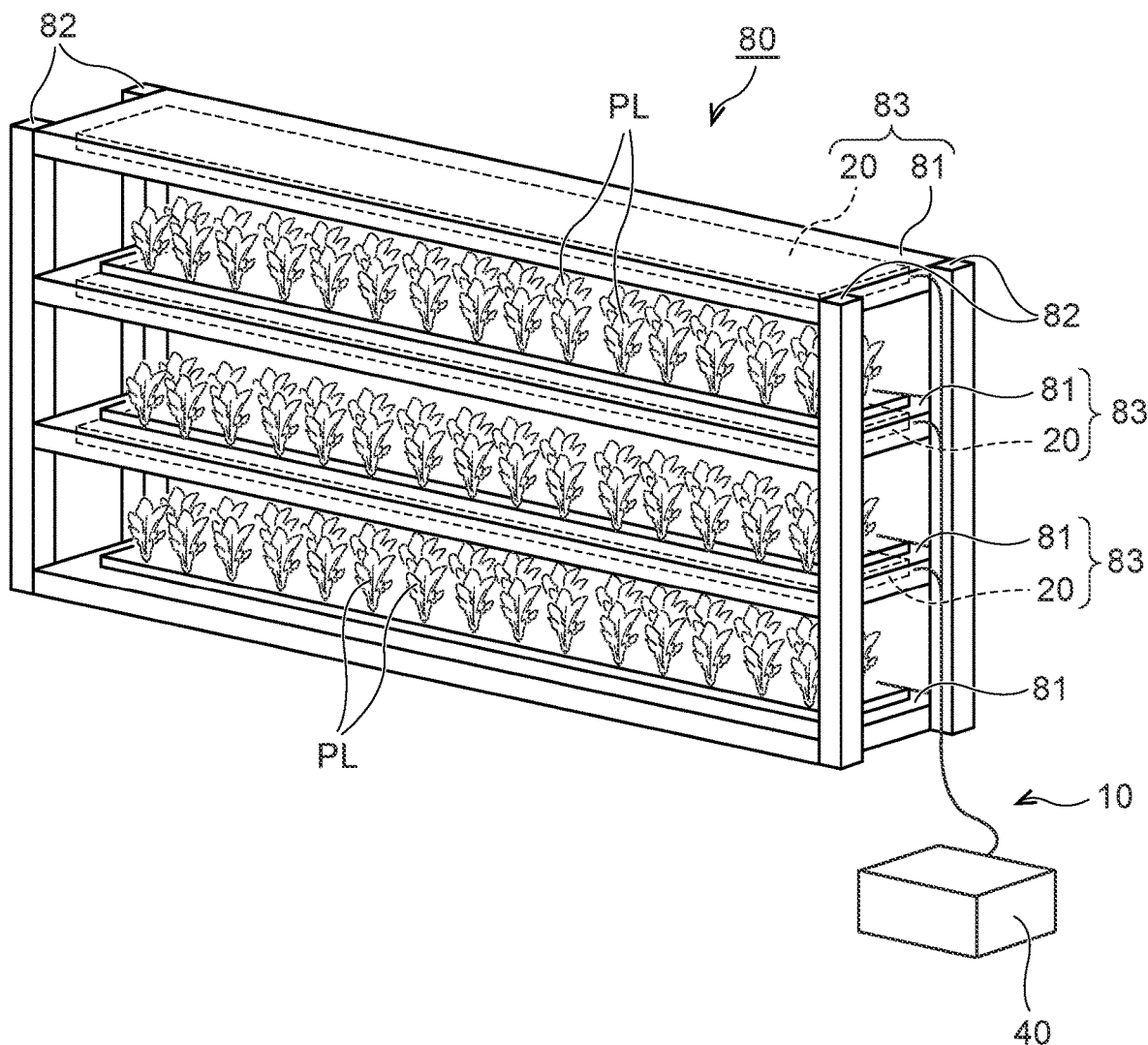
FIG. 9 is a schematic perspective view showing a plant growth rack according to the embodiment.

As shown in FIG. 9, the plant growth rack 80 includes a plurality of (four) posts 82, and a plurality of boards 81 placed with a vertical clearance along the posts 82. A culture medium region for cultivating plants PL is provided on the upper surface of each board 81 except the topmost board 81. The lower surface of each board 81 except the bottommost board 81 makes up a ceiling surface for the board 81 located below the board 81, and the LED lighting sheets 20 are arranged in parallel. In this case, the controller 40 is placed at a location sufficiently away from the LED lighting sheets 20. For this reason, there are small concerns about variations in growth due to heat from the controller 40 between plants PL located closer to the controller 40 and plants PL located far from the controller 40. The shelf 83 for a plant growth rack is made up of the board 81 and the LED lighting sheet 20 attached to the lower side of the board 81. Alternatively, the shelf 83 for a plant growth rack is made up of the board 81 and the LED lighting module 10 attached to the lower side of the board 81. In the present embodiment, the shelf 83 (FIG. 9) for a plant growth rack, the plant growth rack 80 (FIG. 9), and the plant growth factory 90 (FIG. 8) including the plant growth racks 80 are provided.

The LED lighting sheet 20 according to the present embodiment has flexibility and lightweight properties, so attaching the LED lighting sheet 20 to the lower side of each board 81 is easier than attaching an existing straight-tube lighting unit or the like. In addition, the LED lighting sheet 20 has flexibility, so the LED lighting sheet 20 can be attached to ceiling surfaces having various sizes and shapes. As a result, the LED lighting sheet 20 according to the present embodiment is applicable to various plant growth racks 80 and plant growth factories 90.

The LED lighting sheet 20 is made thinner than an existing straight-tube lighting unit. Thus, the vertical clearance between the boards 81 can be narrowed, so the number of the boards 81 included in each plant growth rack 80 can be increased. As a result, the crop yield of plants PL per unit area can be increased.

Figure 10A:
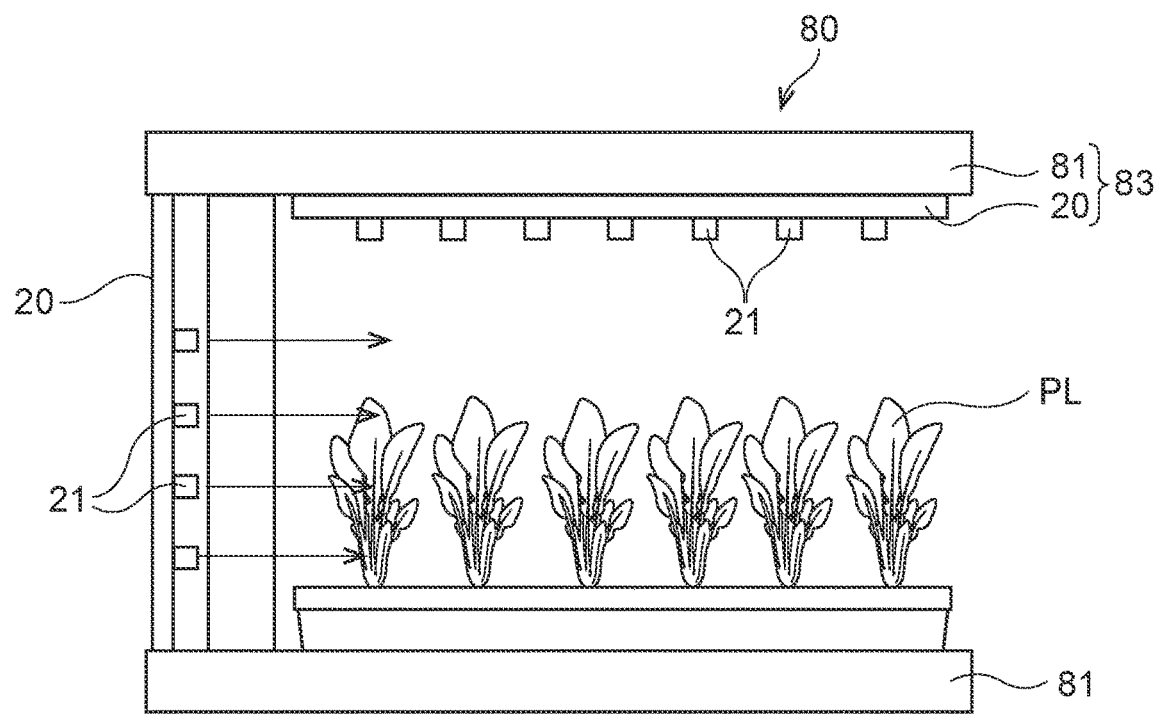
FIG. 10A and FIG. 10B are views showing modifications of the plant growth rack.
Figure 10B:
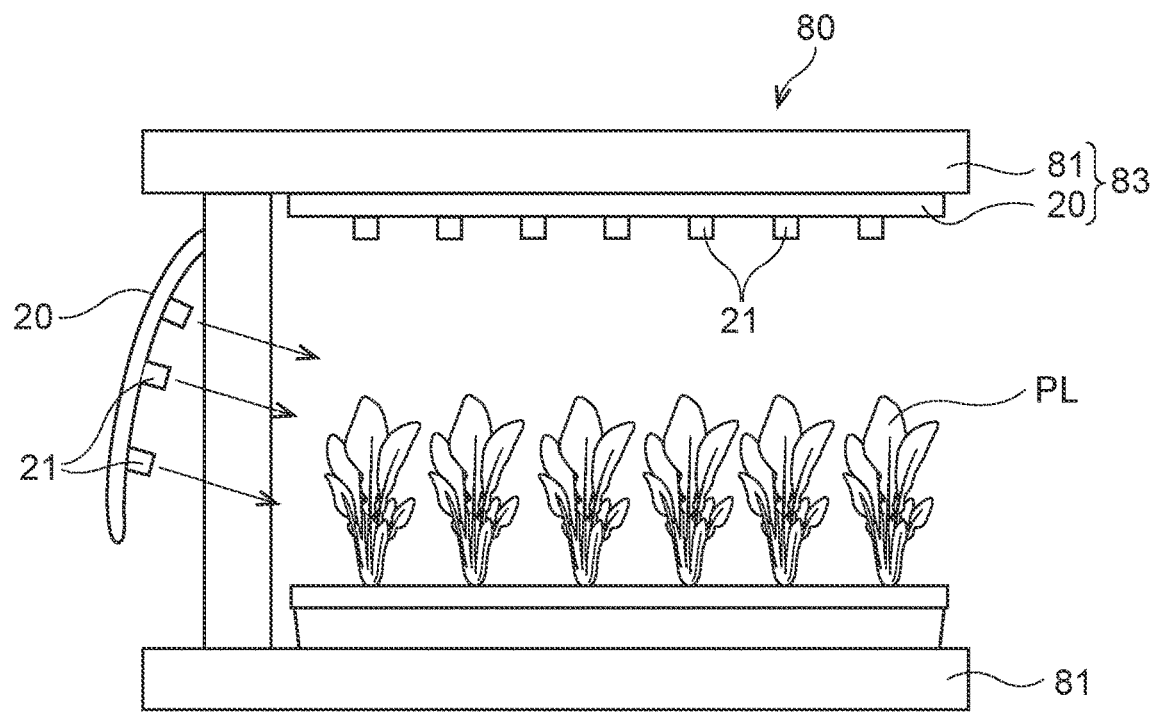

As shown in FIG. 10A and FIG. 10B, the LED lighting sheet 20 may be placed not only on the lower side of the board 81 but also to the side of the board 81. The side LED lighting sheet 20 is hung from the upper board 81 toward the lower board 81 located below the upper board 81. In this case, as shown in FIG. 10A, the LED lighting sheet 20 may reach the lower board 81. Alternatively, as shown in FIG. 10B, the LED lighting sheet 20 may cover only the upper side of the space located between the upper and lower boards 81 without reaching the lower board 81. In this way, when the LED lighting sheet 20 is further placed to the side of the board 81, the amount of light at the periphery of the board 81 where the illuminance tends to decrease is compensated, with the result that the brightness of the LED lighting sheet 20 can be equalized in the plane. As a result, the growth of plants can be equalized in the plane, so the yield of plants grown is improved.

Figure 11:
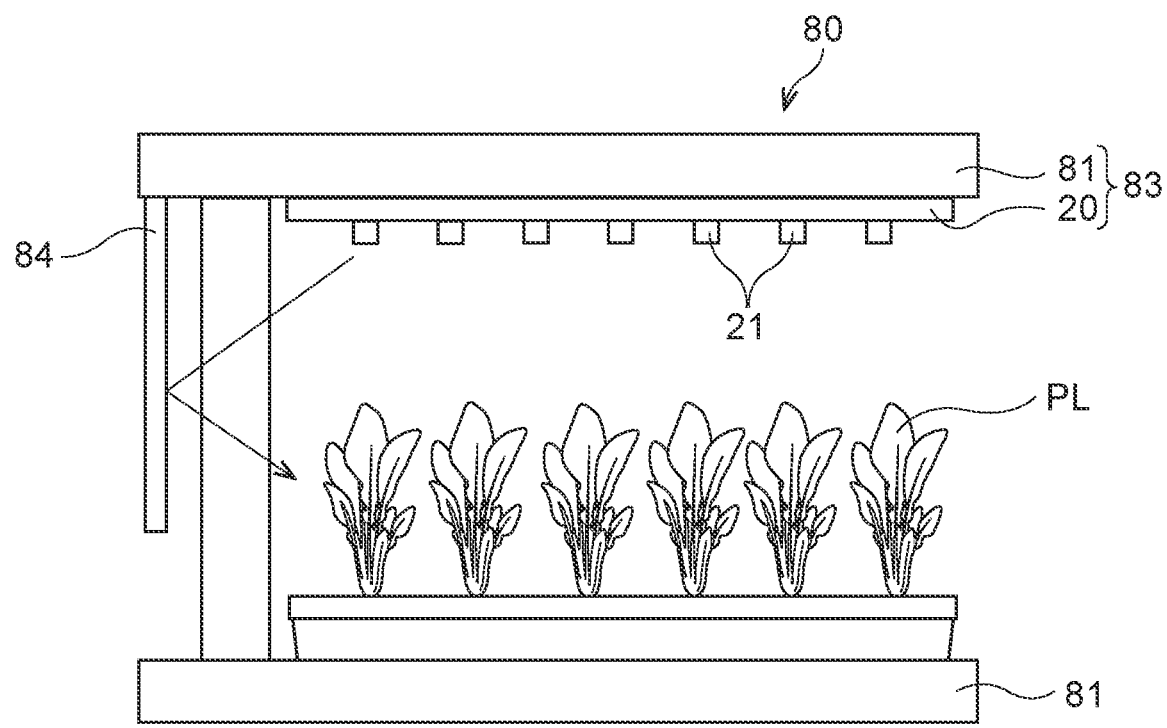
FIG. 11 is a view showing a modification of the plant growth rack.

As shown in FIG. 11, a light reflection sheet 84 may be placed to the side of the shelf 83. The light reflection sheet 84 includes at least a light reflection material, such as an aluminum sheet, on the inner side (the side facing plants). The light reflection sheet 84 is hung from the upper shelf 83 located above toward the lower shelf 83 located below the upper shelf 83. In this way, when the light reflection sheet 84 is placed to the side of the shelf 83, the amount of light at the periphery of the shelf 83 where the illuminance tends to decrease is compensated, with the result that the brightness of the LED lighting sheet 20 can be equalized in the plane, and the yield of plants grown is improved.

Operation of Present Embodiment

Next, the operation of the present embodiment configured as described above will be described.

Initially, the power input section 41 (see FIG. 2) of the LED lighting module 10 is connected to a power supply, and, for example, an alternating current having a selected voltage of 100 V to 240 V is supplied to the power input section 41. Subsequently, a current input to the power input section 41 is converted to a constant direct-current voltage (for example, 44 V) by the AC/DC converter 42. Subsequently, a direct-current voltage from the AC/DC converter 42 is adjusted in the pulse width of a constant voltage waveform in the PWM control section 43, and the LED chips 21 are controlled to a predetermined luminous flux. After that, a constant voltage from the PWM control section 43 is supplied to the LED lighting sheet 20, and the LED chips 21 light up.

Light from the LED chips 21 of the LED lighting sheet 20 reaches plants placed on the shelf 83 and accelerates the growth of the plants. In the present embodiment, at any location 50 mm away from the LED chips 21 in the lower region below the LED lighting sheet 20, a photosynthetic photon flux density (PPFD) converted by input power and normalized by an average value over the lower region is greater than or equal to 0.2. In this way, when a PPFD at any location 50 mm away from the LED chips 21 is increased, the brightness of the LED lighting sheet 20 is increased, with the result that the growth of plants placed on the shelf 83 is accelerated.

On the other hand, the inventors of the present application have found that, only when the brightness of the LED lighting sheet is simply increased, the speed of growth varied particularly in a late growth stage of plants and, as a result, defective growth increases. Specifically, in a late growth stage of plants, some of plants may not sufficiently grow up or growth impairment called tip burn may occur in some of plants. This is presumably because, in a late growth stage of plants, the leaves of plants approach the upper LED lighting sheet, a large amount of light is supplied to plants close to the LED chips while sufficient light is not supplied to plants far from the LED chips, and, as a result, a difference in growth speed occurs between these plants.

In contrast, in the present embodiment, a variation in PPFDs respectively measured at a plurality of locations 50 mm away from the LED chips 21 in the lower region below the LED lighting sheet 20 is less than or equal to 0.5 in standard deviation when normalized by the average value. In this way, by reducing a variation in PPFDs at locations close to the LED chips 21 (that is, locations 50 mm away from the LED chips 21), the amount of light from the LED chips 21 is equalized below the LED lighting sheet.

Figure 12A:
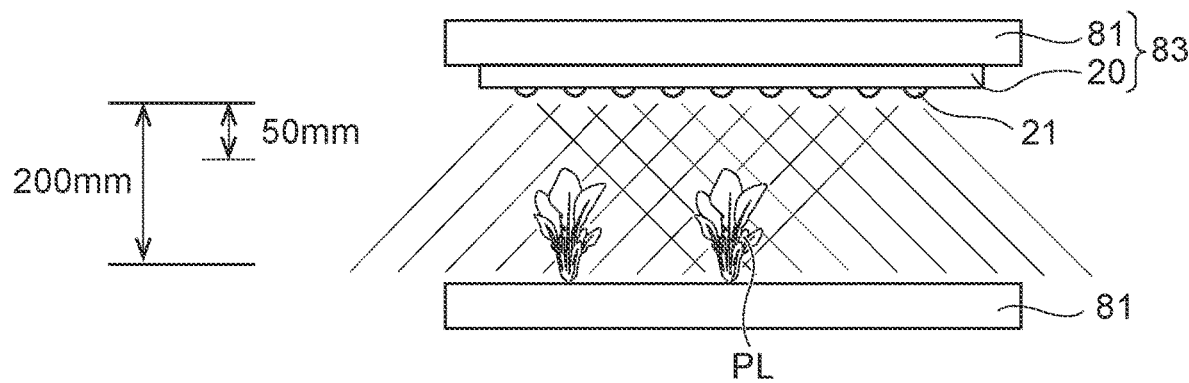
FIG. 12A is a schematic view showing a state where light is irradiated downward from the LED lighting sheet according to the embodiment.

In this way, when a variation in PPFDs at locations 50 mm away from the LED chips 21 is reduced, the amount of light irradiated from the LED chips 21 is equal in the plane, with the result that a place where the amount of light irradiated is insufficient is eliminated in the lower region below the LED lighting sheet 20 (see FIG. 12A). In other words, in the present embodiment, since the LED chips 21 of the LED lighting sheet 20 are substantially equally placed in the plane, so the growth speeds of plants in a late growth stage of plants are equalized in the plane. A place where the amount of light irradiated from the LED chips 21 is excessive disappears, so an occurrence of growth impairment called tip burn in plants is reduced.

Figure 12B:
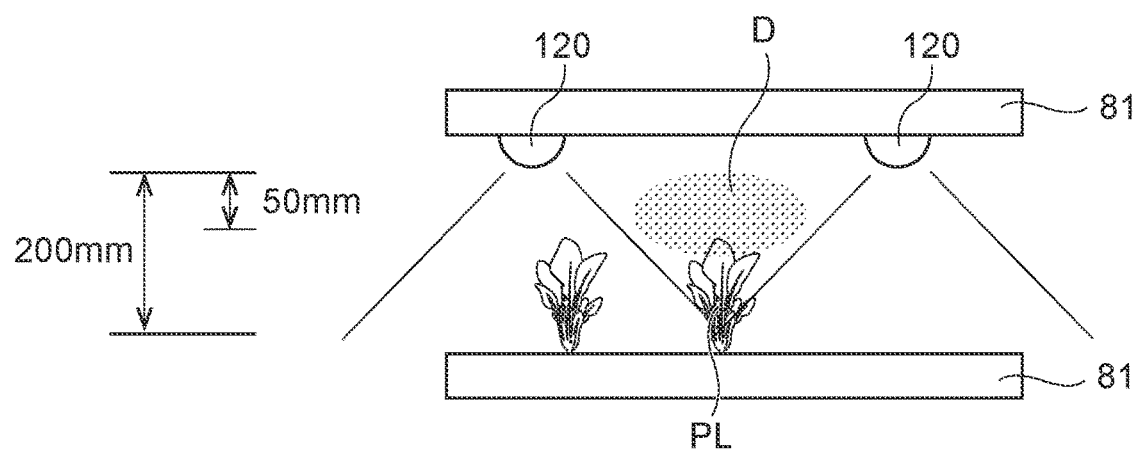
FIG. 12B is a schematic view showing a state where light is irradiated downward from an LED bar light in which a plurality of straight-tube LEDs is arranged as a comparative example.

On the other hand, as a comparative example, when an LED bar light 120 in which straight-tube LEDs are arranged is used (see FIG. 12B), brightness varies in the plane below the LED bar light 120, so the growth speeds of plants may also vary in the plane. In other words, for the LED bar light 120 in which the straight-tube LEDs are arranged, the LED bar lights 120 are spaced apart from each other, so a variation in PPFDs tends to increase as the distance from a light source to plants reduces. For example, the region D in which the brightness is insufficient is present in the region between the LED bar lights 120 and close to the LED bar lights 120. In this case, in a late growth stage of plants, some of plants are present in the region D where the brightness is insufficient. Conversely, light may be excessively irradiated to plants too close to the LED bar lights 120. To address such inconvenience, the distance between plants and the light needs to be kept long in the LED bar light 120, with the result that a long distance needs to be ensured between the upper and lower shelves.

In contrast, according to the present embodiment, when a variation in PPFDs at locations 50 mm away from the LED chips 21 is reduced, an occurrence of plants that delay in growing up due to the insufficient brightness of light or an occurrence of plants that suffer from tip burn due to an excessive brightness of light is reduced. According to the present embodiment, a long distance does not need to be ensured between plants and the LED chips 21, so the distance between the upper and lower shelves 83 can be brought close, and space saving is achieved.

According to the present embodiment, the 10 or more LED chips 21 are arranged in series, and four or more rows of the LED chips 21 are arranged in parallel. With this configuration, the LED chips 21 are equally placed in the plane, and arrays of the LED chips 21 are placed in parallel, so the risk at the time of a break of one or some of the LED chips 21 can be dispersed.

According to the present embodiment, the LED chips 21 are covered with the transparent protective film 35, so the LED chips 21 are protected from moisture that spatters during growth of plants.

According to the present embodiment, since the thickness of the thickest part in the LED lighting sheet 20 is less than or equal to 5 mm, the yield of plants per unit area can be increased by reducing the distance between the upper and lower boards 81 of the plant growth rack 80 and increasing the number of the boards 81.

EXAMPLES

Next, specific examples of the present embodiment will be described.

Preparation of LED Lighting Sheet

Growth racks of Example 1, Example 2, and a growth rack of Comparative Example 1 were prepared as follows.

Example 1

Copper foil (thickness 35 μm) for forming a metal wiring portion was laminated on one of the surfaces of a 560 mm×390 mm film substrate (polyethylene naphthalate, thickness 50 μm), and then the copper foil for metal wires was subjected to etching to form the metal wiring portion with the same pattern in all the examples and comparative examples. Then, a light reflection insulating protective film with a thickness of 10 μm was formed on the substrate film and the metal wiring portion by screen printing using electrically insulating ink made up of a urethane resin as a base resin and 20 percent by mass of titanium oxide added to the base resin. Subsequently, a plurality of LED chips ("NFSW757G-V2" (produced by NICHIA Corporation)) was implemented on the metal wiring portion in a matrix of 14 rows by 10 columns by soldering at a pitch of 40 mm in the X direction and at a pitch of 35 mm in the Y direction. Furthermore a transparent protective film that covers the electrically insulating protective film and the LED chips was formed by spray coating. In the LED lighting sheet prepared as described above, the total luminous flux was 3950 lm, the total input power was 72 W, and the color temperature of light irradiated from the LED chips was 5000K. The two LED lighting sheets were placed on the lower side of the board of the growth rack to prepare the growth rack of Example 1.

Example 2

The growth rack prepared similarly to Example 1 was used as the growth rack of Example 2 except that the light reflection sheet (see FIG. 11) was provided to the side of the shelf.

Comparative Example 1

Two commercially available LED bar lights in which straight-tube LEDs were arranged (TECO-L4ON1-50NH-T8 (produced by TOSHIN ELECTRIC Co., Ltd.)) were placed on the lower side of the board of the growth rack to prepare the growth rack of Comparative Example 1. In this case, in the LED bar lights, the total luminous flux was 2300 lm, the input power was 46 W, and the color temperature of light irradiated was 5000K.

Comparative Example 2

The growth rack prepared similarly to Comparative Example 1 was used as the growth rack of Comparative Example 2 except that the light reflection sheet (see FIG. 11) was provided to the side of the shelf.

For the growth racks of Example 1, Example 2, Comparative Example 1, and Comparative Example 2, the photosynthetic photon flux densities (PPFDs) were measured. In this case, for Example 1 and Example 2, the total input power was adjusted with a light control device so as to be equivalent to those of Comparative Example 1 and Comparative Example 2, and PPFDs were measured at a plurality of locations (24 locations in total) included in the lower region below the LED lighting sheet. For the growth racks of Comparative Example 1 and Comparative Example 2 as well, PPFDs were measured at a plurality of locations (24 locations in total) included in a region similar to those of Example 1 and Example 2. A photosynthetic photon flux density (PPFD) was measured with a quantameter (Quantum sensor LI-190R and Light meter LI-250A produced by LI-COR, Inc. U.S.). In this case, for the growth racks of Example 1, Example 2, Comparative Example 1, and Comparative Example 2, PPFDs were measured at locations 50 mm away from the LED chips and at locations 200 mm away from the LED chips, converted by input power, and then normalized by an average value over the lower region, were calculated. For each of the locations 50 mm away from the LED chips and the locations 200 mm away from the LED chips, measured values of PPFDs were normalized by the average value, and a standard deviation was calculated as a variation in PPFDs.

Subsequently, plants (extremely early maturing cisco) were actually cultivated by using the growth racks of Example 1, Example 2, Comparative Example 1, and Comparative Example 2. After that, fresh weights (g/m²) were measured as the growth rates of plants grown, and fresh weights per input power (g/m²/W) were calculated by dividing the fresh weights (g/m²) by the input power. The fresh weights were measured by measuring above-ground part fresh weight under conditions in which tip burn (burned tip) portions were removed through appearance evaluation of lettuce after completion of cultivation for each cultivation panel and calculating a weight per square meter. The above evaluation results are shown in Table 1.

the case where the growth racks of Comparative Example 1 and Comparative Example 2 were used, so it is presumable that uneven light intensity was small immediately below the light source, an occurrence of tip burn that increases in a positive correlation with light intensity was reduced, and defective portions to be removed were small, leading to high productivity.

The plurality of component elements described in the embodiment and the modifications may be combined as needed. Alternatively, some component elements may be deleted from all the component elements described in the embodiment and the modifications.

The invention claimed is:

1. An LED lighting sheet for animal/plant growth, comprising:
an array of LED chips;

TABLE 1

|  | EXAMPLE 1 | EXAMPLE 2 | COMPARATIVE EXAMPLE 1 | COMPARATIVE EXAMPLE 2 |
| --- | --- | --- | --- | --- |
| LIGHT REFLECTION SHEET | NOT PROVIDED | PROVIDED | NOT PROVIDED | PROVIDED |
| TOTAL LUMINOUS FLUX (lm) | 2600 | 2600 | 2300 | 2300 |
| TOTAL INPUT POWER (W) | 46 | 46 | 46 | 46 |
| COLOR TEMPERATURE (K) | 5000 | 5000 | 5000 | 5000 |
| VALUE NORMALIZED BY AVERAGE VALUE OVER LOWER REGION AFTER CONVERTED BY INPUT POWER (200 mm) | 0.31 OR GREATER | 0.44 OR GREATER | 0.37 OR GREATER | 0.36 OR GREATER |
| VARIATION IN PPFDs (200 mm) | 0.24 | 0.20 | 0.21 | 0.21 |
| VALUE NORMALIZED BY AVERAGE VALUE OVER LOWER REGION AFTER CONVERTED BY INPUT POWER (50 mm) | 0.23 OR GREATER | 0.24 OR GREATER | 0.16 OR GREATER | 0.24 OR GREATER |
| VARIATION IN PPFDs (50 mm) | 0.35 | 0.23 | 0.83 | 0.84 |
| FRESH WEIGHT PER INPUT POWER (g/m²/W) | 1.61 | 1.67 | 1.46 | 1.50 |
| TIP BURN OCCURRENCE | SMALL | SMALL | MANY | MANY |

As shown in Table 1, when the growth racks of Example 1 and Example 2 were compared with the growth racks of Comparative Example 1 and Comparative Example 2, there was no large difference in variation in PPFDs at locations 200 mm away from the LED chips; however, there was a large variation in PPFDs at locations 50 mm away from the LED chips. In this way, when the LED lighting sheets (Example 1 and Example 2) were used, a variation in PPFDs at locations close to the light source was reduced as compared to the case where the LED bar lights (Comparative Example 1 and Comparative Example 2) in which the straight-tube LEDs were arranged were used.

When the growth racks of Example 1 and Example 2 were used, the fresh weight of plants per input power was increased as compared to the case where the growth racks of Comparative Example 1 and Comparative Example 2 were used. When the growth racks of Example 1 and Example 2 were used, a difference in occurrence of tip burn was found, which is different from the case where the growth racks of Comparative Example 1 and Comparative Example 2 were used. In this way, when the growth racks of Example 1 and Example 2 were used, a variation in PPFDs at locations 50 mm away from the LED chips was reduced as compared to a substrate;
a metal wiring portion formed on a surface of the substrate;
a light reflection insulating protective film formed in a region, other than a region in which the LED chips are provided or their peripheral regions, and placed on the metal wiring portion; and
a transparent protective film formed so as to cover the light reflection insulating protective film and the LED chips,
wherein:
the plurality of LED chips is implemented on the metal wiring portion,
a thickness of the metal wiring portion is greater than or equal to 10 μm and less than or equal to 50 μm,
at any location 50 mm away from the LED chips in a lower region below the LED lighting sheet for animal/plant growth, a photosynthetic photon flux density converted by input power and normalized by an average value over the lower region is greater than or equal to 0.2, and
a variation in photosynthetic photon flux densities respectively measured at locations 50 mm away from the LED chips in the lower region below the LED lighting sheet for animal/plant growth is less than or equal to 0.5 in standard deviation when normalized by the average value.

2. The LED lighting sheet for animal/plant growth according to claim 1, wherein ten or more of the LED chips are arranged in series, and four or more rows of the LED chips arranged in series are arranged in parallel.

3. The LED lighting sheet for animal/plant growth according to claim 1, wherein a thickness of a thickest part of the LED lighting sheet is less than or equal to 5 mm.

4. An LED lighting module for animal/plant growth, comprising:
the LED lighting sheet for animal/plant growth according to claim 1; and
a controller electrically connected to the LED lighting sheet for animal/plant growth.

5. A shelf for an animal/plant growth rack, comprising:
a board; and
the LED lighting sheet for animal/plant growth according to claim 1, attached to the board.

6. An animal/plant growth rack comprising a shelf, wherein
the shelf includes the LED lighting sheet for animal/plant growth according to claim 1, attached to a lower side of a board.

7. The animal/plant growth rack according to claim 6, wherein a light reflection sheet is placed to a side of the shelf.

8. An animal/plant growth factory comprising:
a building; and
the animal/plant growth rack according to claim 6, placed in the building.

9. A shelf for an animal/plant growth rack, comprising:
a board; and
the LED lighting module for animal/plant growth according to claim 4, attached to the board.

10. An animal/plant growth rack comprising a shelf, wherein
the shelf includes the LED lighting module for animal/plant growth according to claim 6, attached to a lower side of a board.

11. The LED lighting sheet for animal/plant growth according to claim 1, wherein:
the light reflection insulating protective film is formed by using a resin composition having a urethane resin,
a thickness of the light reflection insulating protective film is greater than or equal to 5 μm and less than or equal to 50 μm,
the light reflection insulating protective film contains a white pigment made up of an inorganic filler, and
at wavelengths of greater than or equal to 400 nm and less than or equal to 780 nm, an average light reflectance of the light reflection insulating protective film is higher than or equal to 65%.

12. The LED lighting sheet for animal/plant growth according to claim 1, wherein:
the transparent protective film is formed by using a resin composition having an acrylic urethane resin, and
a thickness of the transparent protective film is greater than or equal to 10 μm and less than or equal to 40 μm.

* * * * *